(12) United States Patent
Shimizu

(10) Patent No.: US 7,741,695 B2
(45) Date of Patent: Jun. 22, 2010

(54) SEMICONDUCTOR DEVICE

(75) Inventor: Kazuhiro Shimizu, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 314 days.

(21) Appl. No.: 10/919,405

(22) Filed: Aug. 17, 2004

(65) Prior Publication Data

US 2005/0179089 A1 Aug. 18, 2005

(30) Foreign Application Priority Data

Feb. 18, 2004 (JP) ............................. 2004-041009

(51) Int. Cl.
*H01L 29/00* (2006.01)

(52) U.S. Cl. .................. 257/502; 257/501; 257/493; 257/481; 257/E29.265; 257/E21.421

(58) Field of Classification Search .................. 257/502, 257/501, 493, 481, E29.265, E21.421
See application file for complete search history.

(56) References Cited

U.S. PATENT DOCUMENTS

| | | | |
|---|---|---|---|
| 4,292,642 | A | 9/1981 | Appels et al. |
| 5,455,439 | A | 10/1995 | Terashima et al. |
| 5,502,632 | A | 3/1996 | Warmerdam et al. |
| 5,883,547 | A | 3/1999 | Diazzi et al. |
| 6,031,412 | A | 2/2000 | Genova et al. |
| 6,060,948 | A | 5/2000 | Tarantola et al. |
| 6,507,085 | B2 | 1/2003 | Shimizu |
| 7,294,901 | B2 | 11/2007 | Shimizu |

FOREIGN PATENT DOCUMENTS

| | | |
|---|---|---|
| DE | 10 2004 022 376 A1 | 12/2004 |
| JP | 5-190693 | 7/1993 |
| JP | 9-65571 | 3/1997 |
| JP | 9-503116 | 3/1997 |
| JP | 11-68530 | 3/1999 |
| JP | 11-68531 | 3/1999 |
| JP | 2002-324848 | 11/2002 |

OTHER PUBLICATIONS

German Office Action Issued in German Application No. 10 2004 059 627.1-33 dated Nov. 30, 2007.

*Primary Examiner*—Lynne A Gurley
*Assistant Examiner*—Samuel A Gebremariam
(74) *Attorney, Agent, or Firm*—McDermott Will & Emery LLP

(57) ABSTRACT

Extending from an upper surface of an $n^-$ semiconductor layer on a $p^-$ semiconductor substrate to the interface between the $n^-$ semiconductor layer and the $p^-$ semiconductor substrate, a $p^+$ impurity region is provided. The $p^+$ impurity region defines a high-potential island region, a low-potential island region and a slit region in the $n^-$ semiconductor layer. The $n^-$ semiconductor layer in the high-potential island region and the $n^-$ semiconductor layer in the low-potential island region are connected by the $n^-$ semiconductor layer in the slit region, and a logic circuit is formed in the $n^-$ semiconductor layer in the high-potential island region. A width in the direction of Y axis of the $n^-$ semiconductor layer in the slit region is set to be narrower than a width in the direction of the Y axis of the $n^-$ semiconductor layer in the high-potential island region.

14 Claims, 28 Drawing Sheets

F I G. 1 4
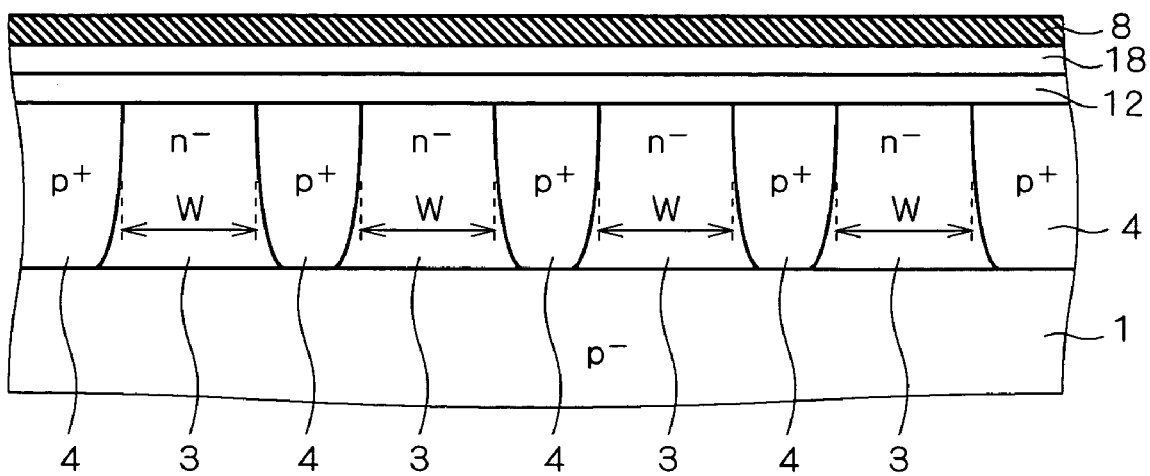
F I G. 1 5
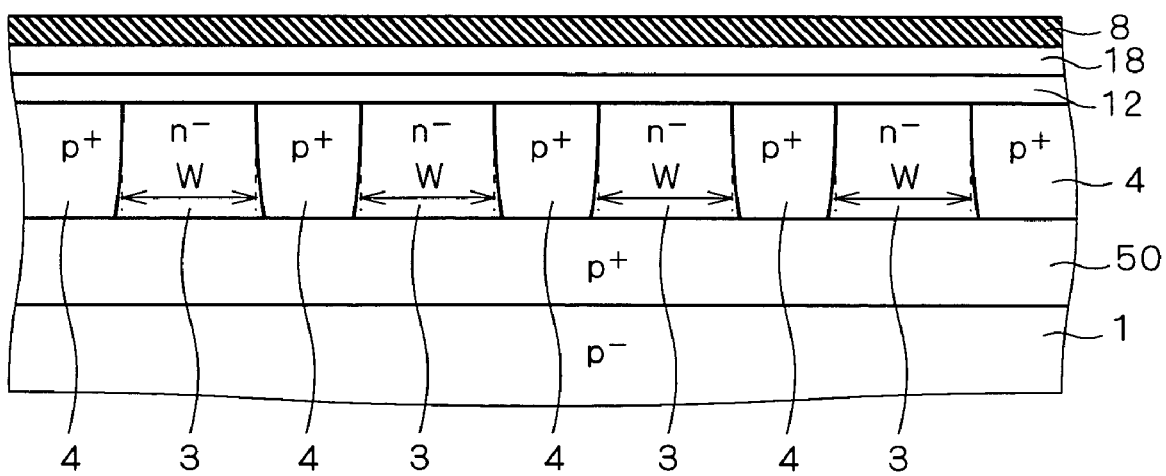

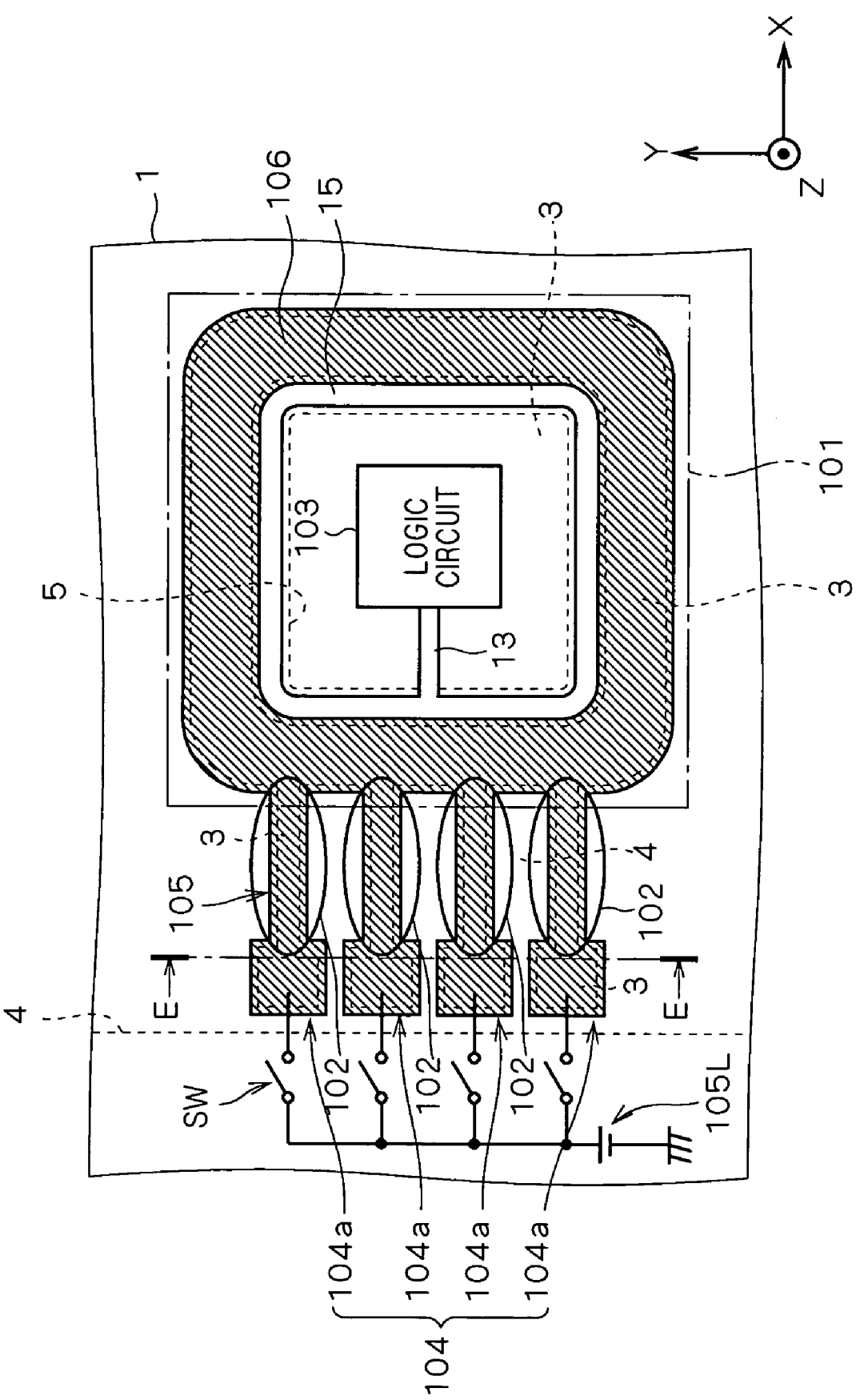

POTENTIAL $V_b$

POTENTIAL $V_O$

DETECTION SIGNAL DSO

POTENTIAL Vb

POTENTIAL Vo

DETECTION SIGNAL DS1

SEMICONDUCTOR DEVICE

BACKGROUND OF THE INVENTION

1. Field of the Invention

This invention relates to a semiconductor device, and in particular to a high voltage IC (hereinafter referred to as an "HVIC").

2. Description of the Background Art

Japanese Patent Application Laid-Open No. 2002-324848 discloses a technique for an HVIC. This technique utilizes a RESURF (REduced SURface Field) effect to achieve a high breakdown voltage, and supplies electric charge to a semiconductor element to which a high potential is applied by using a capacity element for the semiconductor element.

U.S. Pat. No. 4,292,642, for example, describes the RESURF effect. Further, Japanese Patent Application Laid-Open No. 5-190693 (1993) discloses a technique of forming multiple field plates isolated from the surroundings and stabilizing an electric field on a surface of a semiconductor substrate by capacitive coupling between the field plates.

In the technique described in the Japanese Patent Application Laid-Open No. 2002-324848, the capacity element is charged through a diode. Therefore, electric charge accumulated in the capacity element is sometimes insufficient due to a voltage drop of the diode, and desired electric characteristics are sometimes unattainable depending on the required specification of a semiconductor device.

Also in the technique described in the Japanese Patent Application Laid-Open No. 2002-324848, a p-type impurity region which is an anode region of the diode is formed in an n-type semiconductor layer on a p-type semiconductor substrate. Therefore, the p-type impurity region, the n-type semiconductor layer and the p-type semiconductor substrate form a pnp parasitic bipolar transistor which operates to sometimes cause leakage of a charging current to the capacity element, making the desired electric characteristics unattainable.

SUMMARY OF THE INVENTION

It is an object of this invention to provide a technique capable of improving electric characteristics of a semiconductor device.

A first semiconductor device according to this invention includes a semiconductor substrate of p-type, a semiconductor layer of n-type formed on the semiconductor substrate, a first impurity region of the p-type having a higher impurity concentration than the semiconductor layer, a first buried impurity region of the n-type having a higher impurity concentration than the semiconductor layer, and a semiconductor element. The first impurity region is formed in the semiconductor layer, extending from an upper surface of the semiconductor layer to the interface between the semiconductor layer and the semiconductor substrate, to define first to third regions in the semiconductor layer. The first buried impurity region is formed at the interface in the first region. The semiconductor element is formed in the semiconductor layer above the first buried impurity region. A capacity element is electrically connected to the semiconductor layer in the first region. The semiconductor layer in the first region and the semiconductor layer in the second region are connected to each other by the semiconductor layer in the third region. In plan view, a width of the semiconductor layer in the third region in the direction perpendicular to the direction along which the first and third regions are arranged is narrower than a width of the semiconductor layer in the first region.

The application of a reverse voltage to a pn junction formed of the first impurity region of the p-type and the semiconductor layer of the n-type leads to the formation of a depletion layer around the semiconductor element, thereby protecting the semiconductor element.

Further, a parasitic JFET can be formed such that both end portions of the semiconductor layer in the third region serve as its drain and source, respectively, and the first impurity region in contact with the semiconductor layer in the third region serves as its gate. Accordingly, the application of a forward potential to the semiconductor layer in the second region allows the capacity element electrically connected to the semiconductor layer in the first region to be charged through the JFET. Therefore, the charging current is supplied to the capacity element without going through the pn junction, which supplies more sufficient electric charge to the capacity element than through a diode. As a result, a semiconductor device with excellent electric characteristics can be obtained.

Moreover, because the width of the semiconductor layer in the third region is set to be narrower than that of the semiconductor layer in the first region, the width of the semiconductor layer in the third region can be maintained at a small value with the widening of the width of the semiconductor layer in the first region for forming a semiconductor element with a large footprint, which allows a depletion layer to be easily formed across almost the whole semiconductor layer in the third region. Therefore, the leakage of the accumulated electric charge in the capacity element can be reduced even when the potential at the semiconductor layer in the first region becomes higher than that at the semiconductor layer in the second region after the charging has completed.

A second semiconductor device according to this invention includes a semiconductor substrate of p-type, a semiconductor layer of n-type formed on the semiconductor substrate, a first impurity region of the p-type having a higher impurity concentration than the semiconductor layer, first and second buried impurity regions of the n-type having a higher impurity concentration than the semiconductor layer, a semiconductor element, and a second impurity region of the p-type. The first impurity region is formed in the semiconductor layer, extending from an upper surface of the semiconductor layer to the interface between the semiconductor layer and the semiconductor substrate, to define first to third regions in the semiconductor layer. The first buried impurity region is formed at the interface in the first region. The semiconductor element is formed in the semiconductor layer above the first buried impurity region. The second impurity region is provided apart from the first impurity region in the upper surface of the semiconductor layer in the second region. The second buried impurity region is provided at the interface in the second region below the second impurity region. A capacity element is electrically connected to the semiconductor layer in the first region. The semiconductor layer in the first region and the semiconductor layer in the second region are connected to each other by the semiconductor layer in the third region. In plan view, a width of the semiconductor layer in the third region in the direction perpendicular to the direction along which the first and third regions are arranged is narrower than a width of the semiconductor layer in the first region.

The application of a forward potential to the semiconductor layer in the second region allows the charging current to be supplied to the capacity element through a pn junction diode formed of the second impurity region and the semiconductor layer in contact thereto. Accordingly, the leakage of the accumulated electric charge in the capacity element can be reduced even when the potential at the semiconductor layer in the first region becomes higher than that at the semiconductor layer in the second region after the charging.

Further, the provision of the second buried impurity region of the n-type having a higher impurity concentration than the semiconductor layer reduces the current amplification factor of a pnp parasitic bipolar transistor formed of the second impurity region of the p-type, the semiconductor layer of the n-type and the semiconductor substrate of the p-type, thereby reducing the leakage of the charging current caused by the operation of the pnp parasitic bipolar transistor. This improves the electric characteristics of a semiconductor device.

While the provision of the second buried impurity region of the n-type inhibits the spread of a depletion layer in the semiconductor layer in the second region, the semiconductor layers in the second region and the first region are connected through the semiconductor layer in the third region. The semiconductor layer in the third region is easy to be depleted because the width thereof is narrower than that of the semiconductor layer in the first region. Therefore, the semiconductor elements can be reliably surrounded by the depletion layer, thereby reducing a breakdown voltage reduction caused by providing the second buried impurity region.

These and other objects, features, aspects and advantages of the present invention will become more apparent from the following detailed description of the present invention when taken in conjunction with the accompanying drawings.

BRIEF DESCRIPTION OF THE DRAWINGS

FIG. 14 is a cross-sectional view of the semiconductor device structure according to the third preferred embodiment;

FIG. 15 is a cross-sectional view of a structure of a modification of the semiconductor device according to the third preferred embodiment;

FIG. 16 is a plan view of a semiconductor device structure according to a fourth preferred embodiment of this invention;

DESCRIPTION OF THE PREFERRED EMBODIMENTS

First Preferred Embodiment

Figure 1:
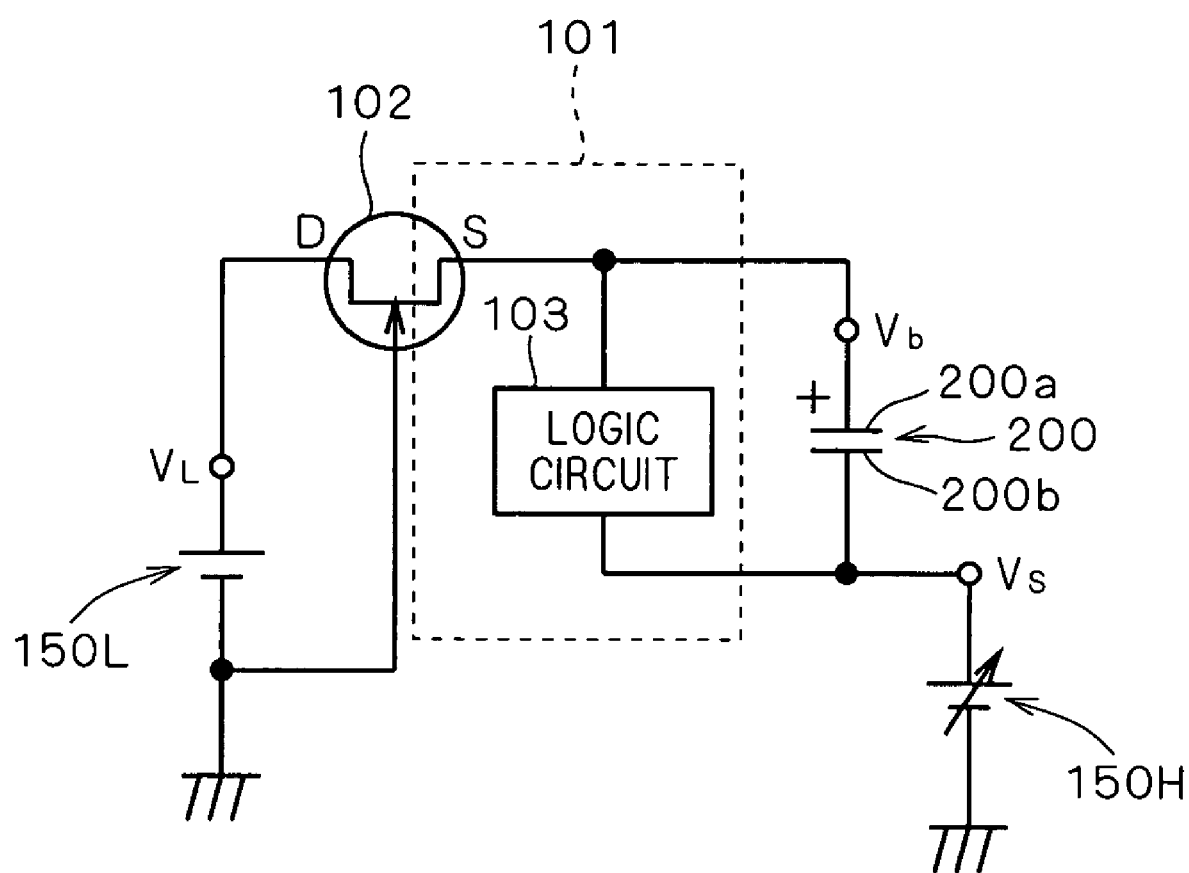
FIG. 1 shows an equivalent circuit of a semiconductor device according to a first preferred embodiment of this invention.

FIG. 1 shows an equivalent circuit of a semiconductor device according to a first preferred embodiment of this invention and its peripheral circuits. The semiconductor device of the first preferred embodiment is an HVIC that includes a logic circuit 103 formed in a high-potential island region 101 as discussed later, and an n-channel type JFET (junction FET) 102 the source of which is connected to the logic circuit 103. The source of the JFET 102 is connected, for example, to a positive power supply terminal of the logic circuit 103.

One end 200a and the other end 200b of a bootstrap capacity element 200 are connected to the logic circuit 103. In this example, the one end 200a and the other end 200b are connected to the positive power supply terminal and a negative power supply terminal of the logic circuit 103, respectively. The potential at the one end 200a is referred to as a "potential $V_b$".

The JFET 102 has a drain connected to a voltage source 150L and a gate applied with a ground potential. Further, a load not shown is connected to the other end 200b of the bootstrap capacity element 200, and the potential at the node varies with load conditions. For example, the node potential becomes a ground potential or a high potential of several hundred volts (hereinafter referred to as a "potential $V_H$"). It is therefore assumed, as shown in FIG. 1, that a virtual voltage source 150H which is a virtual variable voltage source is connected to the other end 200b, and an output potential $V_s$ at the virtual voltage source 150H becomes a ground potential or the potential $V_H$.

The load connected to the other end 200b of the bootstrap capacity element 200 can include two IGBTs that are totem-pole-connected between the potential $V_H$ and a ground potential, the node between those two IGBTs being connected to the other end 200b. The two IGBTs perform switching operations at different timings from each other, and supply the load connected to the node between them with the potential $V_H$ or a ground potential. The voltage source 150L is a constant voltage source, for example, having an output potential $V_L$ of several tens of volts.

Next, the operation of the semiconductor device according to the first preferred embodiment will be discussed. When, with the bootstrap capacity element 200 uncharged, the output potential $V_s$ at the virtual voltage source 150H is a ground potential (0V), the bootstrap capacity element 200 is supplied with electric charge from the voltage source 150L through the JFET 102, to be charged. Consequently, the voltage $V_L$ (=$V_L$−0V) is accumulated in the bootstrap capacity element 200. Meanwhile, the voltage $V_L$ is applied to the power supply of the logic circuit 103, which effects the operation of the logic circuit 103.

When, with the bootstrap capacity element 200 charged, the output potential $V_s$ at the virtual voltage source 150H becomes the potential $V_H$, the source potential at the JFET 102 increases by the potential $V_H$ to become ($V_L$+$V_H$) because a current hardly flows from the source to the drain of the JFET 102 as discussed later. Consequently, the current supply from the voltage source 150L to the positive power supply terminal of the logic circuit 103 comes to a stop, and the electric charge in the bootstrap capacity element 200 is supplied to the positive power supply terminal of the logic circuit 103. That is, a potential ($V_L$+$V_H$) is applied to the positive power supply terminal of the logic circuit 103, and the potential $V_H$ to the negative power supply potential. In this way, the voltage $V_L$ is supplied to the power supply of the logic circuit 103 at all times, which allows the logic circuit 103 to operate with a constant voltage source independently of the value of the output potential $V_s$ at the virtual voltage source 150H.

Figure 2:
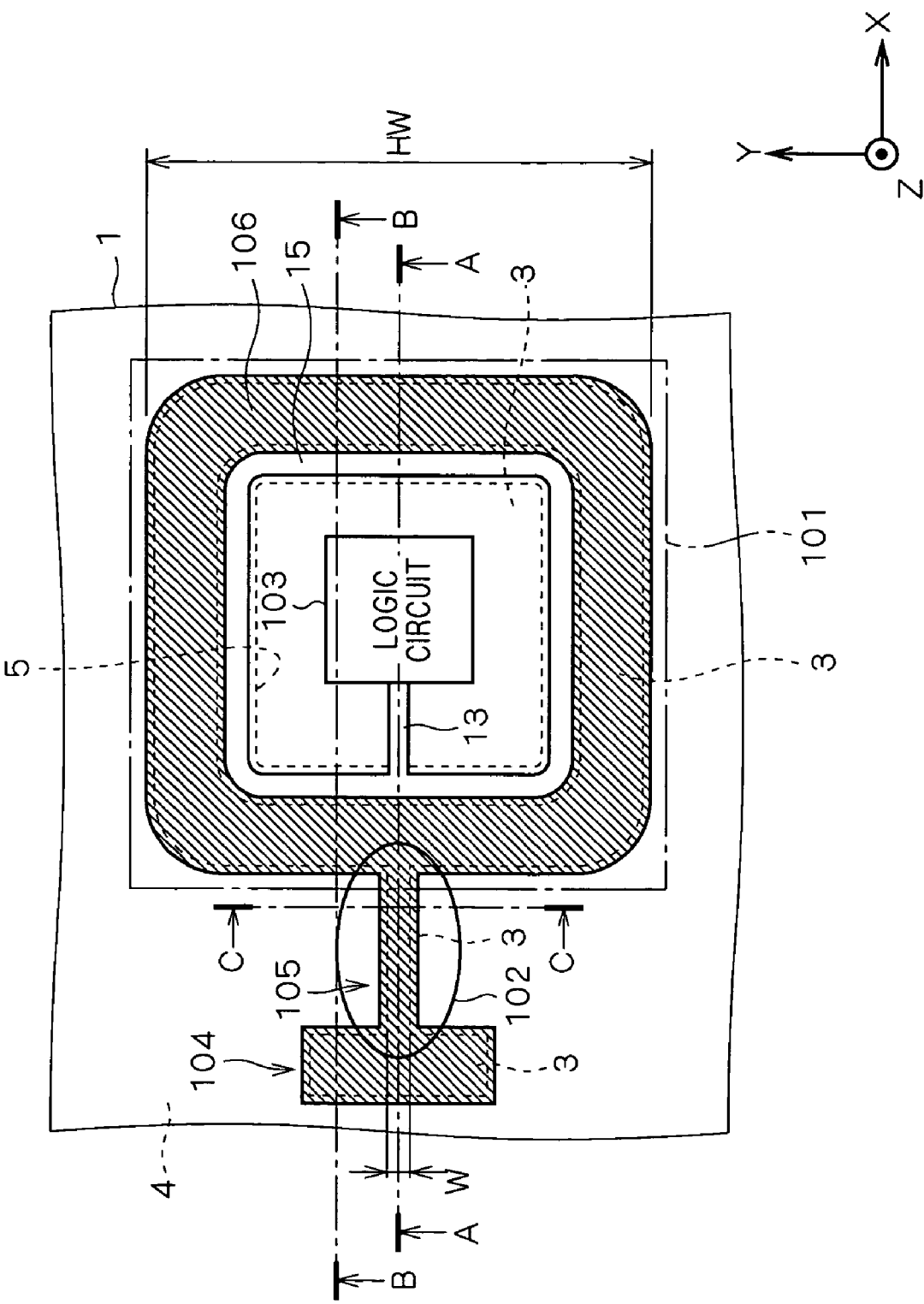
FIG. 2 is a plan view of the semiconductor device structure according to the first preferred embodiment.
Figure 2A:
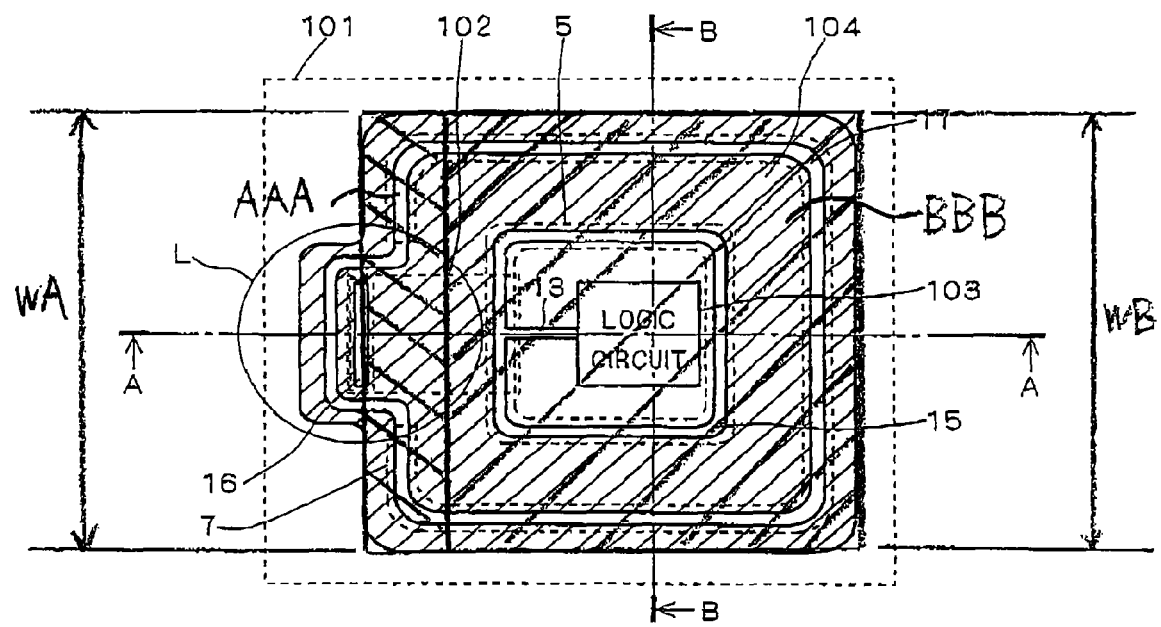
Figure 2B:
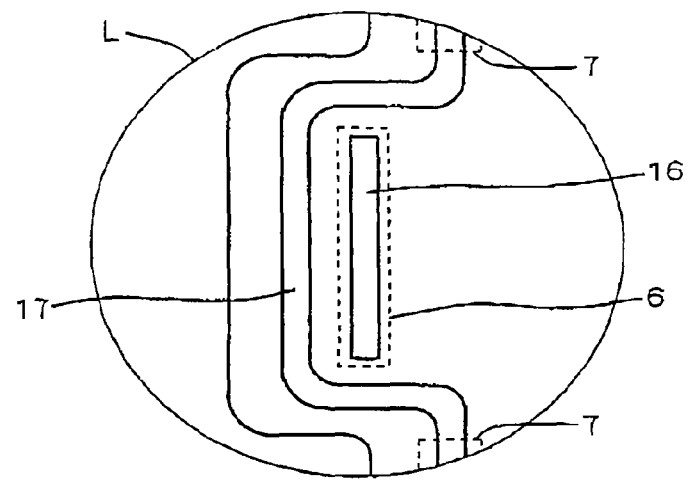
Figure 3:
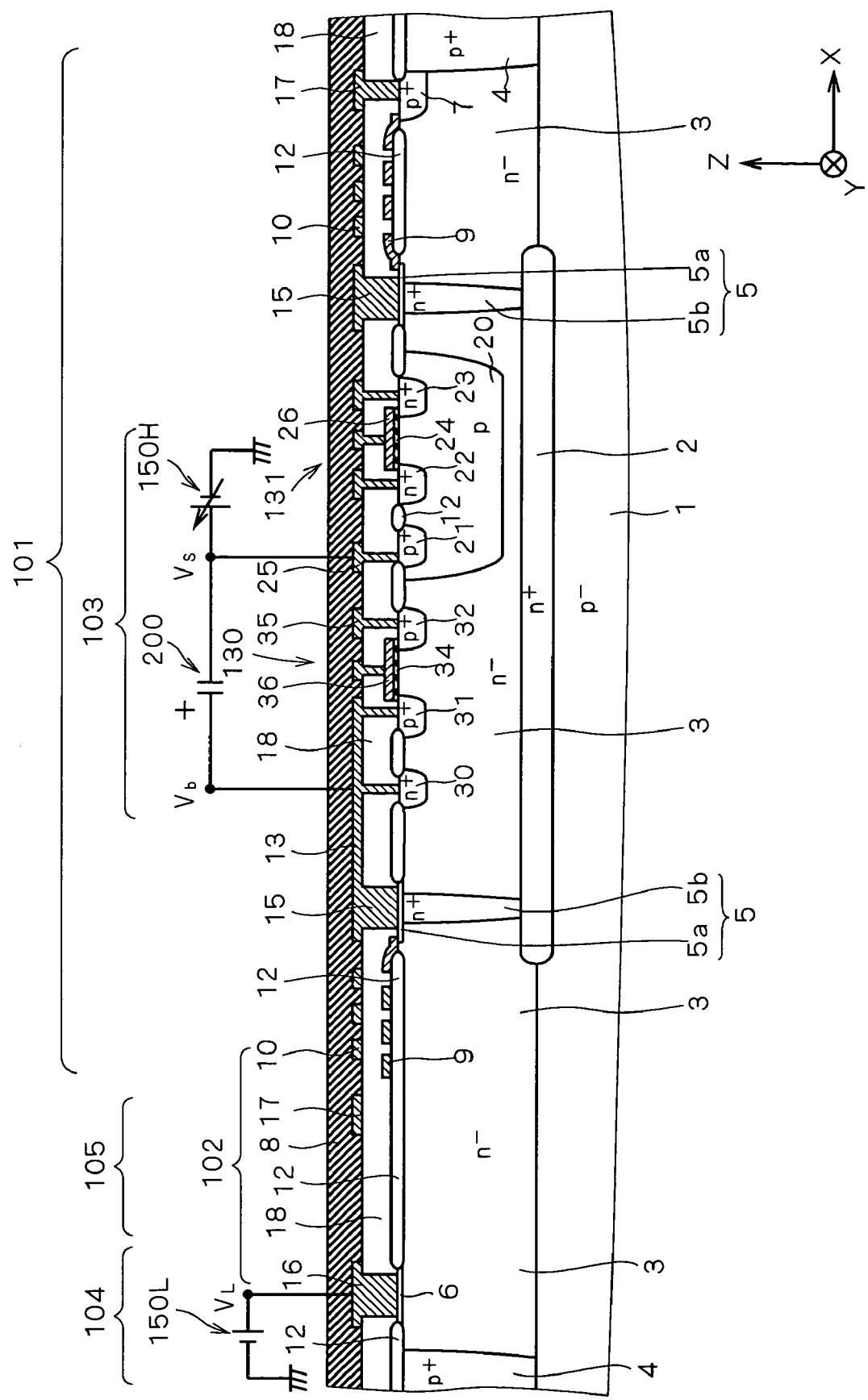
FIGS. 3 to 5 are cross-sectional views of the semiconductor device structure according to the first preferred embodiment.
Figure 4:
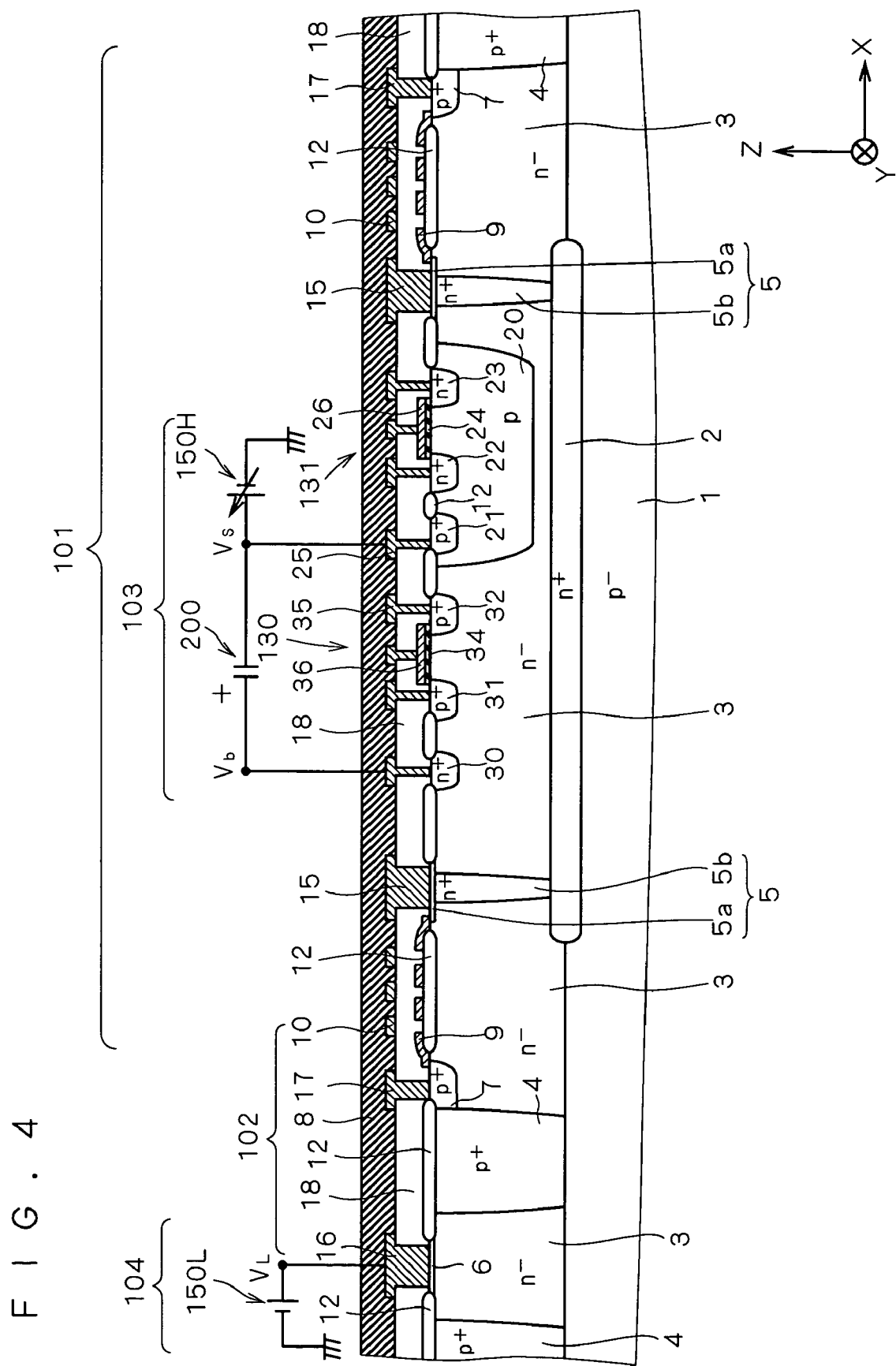
Figure 5:
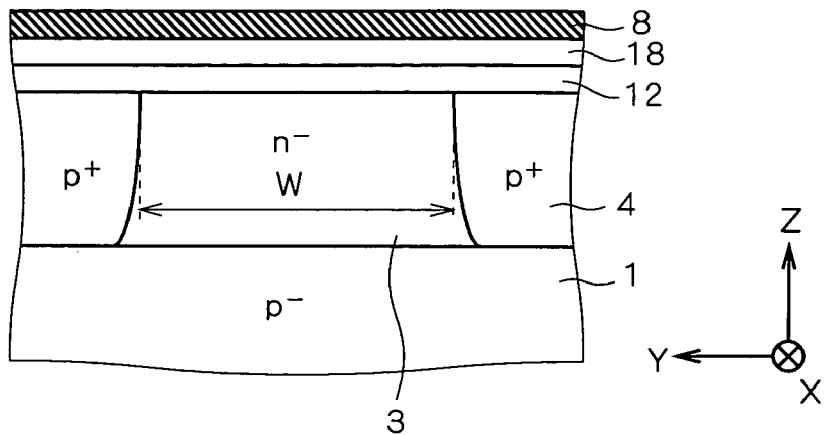

Next, the structure of the semiconductor device according to the first preferred embodiment will be discussed. FIG. 2 is a schematic plan view of the semiconductor device structure, and FIGS. 3 to 5 are cross-sectional views taken along the lines A-A to C-C indicated by the arrows in FIG. 2, respectively. For simplicity's sake, an insulating film 8 in FIGS. 3 to 5 is not shown in FIG. 2, which only shows electrodes 13 and 15 out of the electrodes formed on an insulating film 18. This holds true for the subsequent plan views as well.

In the explanation that follows, symbols "p", "p$^+$", "p$^−$", "n$^+$", "n$^−$" indicate the impurity conductivity types and impurity concentrations of the semiconductor device. The impurity concentration increases in the order of "p$^−$", "p", "p$^+$" and is higher with "n$^+$" than with "n$^−$". Further, the impurity concentration is higher with "p", "p$^+$" than with "n$^−$", and is lower with "p$^−$", "p" than with "n$^+$".

In the semiconductor device of the first preferred embodiment, as shown in FIGS. 2 to 5, an n$^−$ semiconductor layer 3 is formed on a p$^−$ semiconductor substrate 1. Extending from an upper surface of the n$^−$ semiconductor layer 3 to the interface between the n$^−$ semiconductor layer 3 and the p$^−$ semiconductor substrate 1, a p$^+$ impurity region 4 is formed in the n$^−$ semiconductor layer 3. The p$^+$ impurity region 4 is formed to surround part of the n$^−$ semiconductor layer 3, and defines the high-potential island region 101 where the logic circuit 103 is located, a low-potential island region 104 to which the output potential $V_L$ at the voltage source 150L is applied, and a slit region 105, in the n$^−$ semiconductor layer 3.

The n$^−$ semiconductor layer 3 in the high-potential island region 101 and the n$^−$ semiconductor layer 3 in the low-potential island region 104 are connected by the n$^−$ semiconductor layer 3 in the slit region 105. Put another way, the n$^−$ semiconductor layer 3 in the slit region 105 is positioned between the n$^−$ semiconductor layers 3 in the high-potential island region 101 and the low-potential island region 104 and is connected to both.

In plan view, as shown in FIG. 2, the n$^−$ semiconductor layer 3 in the high-potential island region 101 is shaped like a square and has a plurality of sides. The n$^−$ semiconductor layers 3 in the low-potential island region 104 and the slit region 105 are shaped like a rectangle in plan view.

In plan view, the high-potential island region 101, the slit region 105 and the low-potential island region 104 are arranged linearly in this order along the direction of X axis. And in plan view, a width W in the direction of Y axis of the n$^−$ semiconductor layer 3 in the slit region 105 is set to be narrower than a width HW in the direction of the Y axis of the n$^−$ semiconductor layer 3 in the high-potential island region 101. Here, the direction of the Y axis is perpendicular to the direction of the X axis. Therefore, we can say that the width of the n$^−$ semiconductor layer 3 in the slit region 105 in the direction perpendicular to the direction along which the high-potential island region 101 and the slit region 105 are arranged is narrower than that in the high-potential island region 101. Z axis in FIG. 2 is orthogonal to the X and Y axes. That is, the X, Y and Z axes form an orthogonal coordinate system.

As discussed above, the width W of the n$^−$ semiconductor layer 3 in the slit region 105 is narrower than the width HW of the n$^−$ semiconductor layer 3 in the high-potential island region 101. Thus in plan view, as shown in FIG. 2, the n$^−$ semiconductor layer 3 in the slit region 105 can be partially connected to a side of the n$^−$ semiconductor layer 3 in the high-potential island region 101.

At the interface between the n$^−$ semiconductor layer 3 and the p$^−$ semiconductor substrate 1 in the high-potential island region 101, an n$^+$ buried impurity region 2 is selectively formed. The logic circuit 103 is formed in the n$^−$ semiconductor layer 3 above the n$^+$ buried impurity region 2.

The logic circuit 103 includes a p-channel MOSFET 130 and an n-channel MOSFET 131, for example. The p-channel MOSFET 130 has a p$^+$ drain region 31, a p$^+$ source region 32 and a gate electrode 36. The drain region 31 and the source region 32 are formed with predetermined spacing in the upper surface of the n$^−$ semiconductor layer 3, and the gate electrode 36 is formed through a gate insulating film 34 on the n$^−$ semiconductor layer 3 between the drain region 31 and the source region 32. Further in the upper surface of the n$^−$ semiconductor layer 3, an n$^+$ impurity region 30 is formed adjacent to the drain region 31 with predetermined spacing.

The n-channel MOSFET 131 is located adjacent to the p-channel MOSFET 130 and formed in a p-well region 20 in the upper surface of the n$^−$ semiconductor layer 3. The n-channel MOSFET 131 has an n$^+$ drain region 23, an n$^+$ source region 22 and a gate electrode 26. The drain region 23 and the source region 22 are formed with predetermined spacing in an upper surface of the p-well region 20, and the gate electrode 26 is formed through a gate insulating film 24 on the p-well region 20 between the drain region 23 and the source region 22. Further in the upper surface of the p-well region 20, a p$^+$ impurity region 21 is formed adjacent to the source region 22 with predetermined spacing.

Also in the upper surface of the n$^−$ semiconductor layer 3 in the high-potential island region 101, an n$^+$ impurity region 5 including n$^+$ impurity regions 5a and 5b is formed. The n$^+$ impurity region 5 is provided from the upper surface of the n$^−$ semiconductor layer 3 to the n$^+$ buried impurity region 2 and connected to the periphery of the n$^+$ buried impurity region 2. The n$^+$ impurity region 5 is formed to surround the logic circuit 103. The n$^+$ impurity region 5a is formed near the upper surface of the n$^-$ semiconductor layer 3, and the n$^+$ impurity region 5b is connected to the n$^+$ impurity region 5a and extends to the n$^+$ buried impurity region 2.

Further in the upper surface of the n$^-$ semiconductor layer 3 in the high-potential island region 101, a p$^+$ impurity region 7 is formed along the perimeter of the high-potential island region 101 outside the n$^+$ impurity region 5, which is connected to the p$^+$ impurity region 4. The p$^+$ impurity region 7 is not provided in the n$^-$ semiconductor layer 3 at the boundary between the high-potential island region 101 and the slit region 105. In the upper surface of the n$^-$ semiconductor layer 3 in the low-potential island region 104, an n$^+$ impurity region 6 is formed apart from the p$^+$ impurity region 4.

An oxide film 12 is formed on the upper surfaces of the n$^-$ semiconductor layers 3 in the high-potential island region 101, the low-potential island region 104 and the slit region 105, on an upper surface of the p$^+$ impurity region 4, and on the upper surface of the p-well region 20, to expose the n$^+$ impurity regions 5 and 30, the p$^+$ impurity regions 7 and 21, the source regions 22 and 32, the drain regions 23 and 31, and the n$^+$ impurity region 6. On the oxide film 12 provided on the upper surface of the n$^-$ semiconductor layers 3 between the n$^+$ impurity region 5 and the p$^+$ impurity region 7, a plurality of electrodes 9 are formed to surround the n$^+$ impurity region 5 and the logic circuit 103 in plan view. The plurality of electrodes 9 form multiple field plates for improved breakdown voltage of the semiconductor device of the first preferred embodiment. The electrodes 9 as well as the gate electrodes 26 and 36 are made of polysilicon, for example.

In the semiconductor device of the first preferred embodiment, the insulating film 18 is formed to cover the n$^-$ semiconductor layers 3, the oxide film 12, the gate electrodes 26 and 36, and the electrodes 9. Through the insulating film 18, an electrode 16 is connected to the n$^+$ impurity region 6, the electrode 15 to the n$^+$ impurity region 5, and an electrode 17 to the p$^+$ impurity region 7. An electrode 35 is connected through the insulating film 18 to the drain region 31, the source region 32 and the gate electrode 36 of the p-channel MOSFET 130, and the n$^+$ impurity region 30. An electrode 25 is connected through the insulating film 18 to the drain region 23, the source region 22 and the gate electrode 26 of the n-channel MOSFET 131, and the p$^+$ impurity region 21.

The electrode 15 is located along the n$^+$ impurity region 5 to which the electrode 15 itself is connected, to surround the logic circuit 103 in plan view. The electrode 15 is connected by an electrode 13 to the electrode 35 on the drain region 31 and the n$^+$ impurity region 30. The electrode 17 is formed along the p$^+$ impurity region 7 to which the electrode 17 itself is connected, to surround the logic circuit 103 and the electrode 15 in plan view.

A plurality of floating electrodes 10 are located on the insulating film 18 above the electrodes 9, and capacitive coupling between the electrodes 10 and 9 improve the breakdown voltage of the semiconductor device of the first preferred embodiment. The insulating film 8 is formed on the insulating film 18 to cover the respective electrodes.

In the semiconductor device of the first preferred embodiment, the parasitic JFET 102 is formed such that both end portions in the direction of the X axis of the n$^-$ semiconductor layer 3 in the slit region 105 serve as its source and drain, and the p$^+$ impurity region 4 sandwiching the n$^-$ semiconductor layer 3 in the direction of the Y axis serves as its gate. The operation of this JFET 102 allows sufficient electric charge to be supplied to the bootstrap capacity element 200 as discussed later. Between the both end portions, the one on the low-potential island region 104 side functions as the drain of the JFET 102 and the other on the high-potential island region 101 side as the source.

In the semiconductor device of the first preferred embodiment with the above structure, a ground potential is applied to the p$^+$ impurity regions 4 and 7, and the p$^-$ semiconductor substrate 1. Meanwhile, the output potential $V_L$ at the voltage source 150L is applied to the electrode 16, whereby the potential $V_L$ is applied to the n$^-$ semiconductor layer 3 in the low-potential island region 104 and to the drain of the JFET 102.

The electrode 25 connected to the p$^+$ impurity region 21 is the negative power supply terminal of the logic circuit 103, which is applied with the output potential $V_S$ at the virtual voltage source 150H. The electrode 35 connected to the n$^+$ impurity region 30 is the positive power supply terminal of the logic circuit 103, which is electrically connected to the one end 200a of the bootstrap capacity element 200. Accordingly, the potential $V_b$ is applied to the potential at the n$^-$ semiconductor layer 3 in the high-potential island region 101 and to the source of the JFET 102.

As discussed above, when, with the bootstrap capacity element 200 uncharged, the potential $V_S$ is a ground potential, the bootstrap capacity element 200 is charged by the voltage source 150L. The charging current goes through the n$^-$ semiconductor layer 3 in the low-potential island region 104, the n$^-$ semiconductor layer 3 in the slit region 105 which is a channel of the JFET 102, and the n$^-$ semiconductor layer 3 in the high-potential island region 101 in order, to be supplied to the bootstrap capacity element 200.

In this way, in the first preferred embodiment, the charging current is supplied to the bootstrap capacity element 200 without going through a pn junction. Therefore, the potential $V_b$ can be increased to the output potential $V_L$ at the voltage source 150L.

After the bootstrap capacity element 200 has been charged, when the output potential $V_s$ at the virtual voltage source 150H becomes the potential $V_H$, the potential $V_b$ becomes ($V_L+V_H$). Resultant application of a reverse voltage as high as several hundred volts to a pn junction formed of the n$^-$ semiconductor layer 3 in the slit region 105 and the p$^+$ impurity region 4 sandwiching it in the direction of the Y axis leads to the formation of a depletion layer across almost the whole n$^-$ semiconductor layer 3 in the slit region 105. As a result, even when the potential $V_b$ becomes ($V_L+V_H$) which is higher than the output potential $V_L$ at the voltage source 150L as discussed above, the accumulated electric charge in the bootstrap capacity element 200 hardly flows toward the n$^-$ semiconductor layer 3 in the low-potential island region 104, which allows the potential $V_b$ to maintain ($V_L+V_H$). Therefore, the voltage $V_L$ is supplied to the power supply of the logic circuit 103 at all times.

Further, when the output potential $V_S$ at the virtual voltage source 150H becomes the potential $V_H$, a reverse voltage as high as several hundred volts is applied to a pn junction formed of the n$^-$ semiconductor layer 3 in the high-potential island region 101 and the p$^+$ impurity region 4 surrounding it. A resultant RESURF effect leads to the formation of a depletion layer in the n$^-$ semiconductor layer 3 in the high-potential island region 101 opposite the logic circuit 103 with respect to the n$^+$ impurity region 5, i.e. in the whole n$^-$ semiconductor layer 3 outside the n$^+$ impurity region 5 in the high-potential island region 101. The logic circuit 103 is thus surrounded by the depletion layer, thereby achieving a semiconductor device having a high breakdown voltage. A RESURF isolation region 106 indicated by the oblique line in FIG. 2 shows a rough outline of a region where the depletion layer is formed when the output potential $V_S$ at the virtual voltage source 150H becomes the potential $V_H$.

In the semiconductor device of the first preferred embodiment, a circuit (not shown) using the voltage source 150L as its positive power supply is also formed in the n⁻ semiconductor layer 3 which is in other than the low-potential island region 104, the slit region 105 and the high-potential island region 101, and is connected to those regions through the p⁺ impurity region 4. This circuit is hereinafter referred to as a "low breakdown voltage circuit".

In this way, in the semiconductor device of the first preferred embodiment where the parasitic JFET 102 is formed such that both end portions in the direction of the X axis of the n⁻ semiconductor layer 3 in the slit region 105 serve as its source and drain, and the p⁺ impurity region 4 sandwiching the n⁻ semiconductor layer 3 in the direction of the Y axis serves as its gate, the bootstrap capacity element 200 can be charged through the JFET 102. Accordingly, the charging current is supplied to the bootstrap capacity element 200 without going through a pn junction, which allows more sufficient electric charge to be supplied to the bootstrap capacity element 200 than through a diode. As a result, a semiconductor device with excellent electric characteristics can be obtained.

Further in the first preferred embodiment, the width W of the n⁻ semiconductor layer 3 in the slit region 105 is set to be narrower than the width HW of the n⁻ semiconductor layer 3 in the high-potential island region 101. If, conversely, the width W is set to be not narrower than the width HW, the widening of the width HW for forming a large-scale logic circuit 103 with a large footprint leads to the widening of the width W as well, which makes it hard for a depletion layer to be formed across almost the whole n⁻ semiconductor layer 3 in the slit region 105 even when the potential $V_S$ is set at a high potential. This enhances the chances of leakage of the accumulated electric charge in the bootstrap capacity element 200 toward the n⁻ semiconductor layer 3 in the slit region 105.

On the other hand, in the first preferred embodiment where the width W is set to be narrower than the width HW, the width W can be maintained at a small value with the widening of the width HW for forming a large-scale logic circuit 103, which makes it easy for a depletion layer to be formed across almost the whole n⁻ semiconductor layer 3 in the slit region 105. Therefore, the leakage of the accumulated electric charge in the bootstrap capacity element 200 can be reduced and the potential $V_b$ can be maintained at $(V_L+V_H)$.

Besides, it is desirable that the width W of the n⁻ semiconductor layer 3 in the slit region 105 satisfy the following expression (1):

$$w = 2\sqrt{2 \cdot \epsilon_s \cdot V_L/(q \cdot N_d)} \quad (1)$$

In the above expression, $N_a \gg N_d$, $\epsilon_s$ denotes the dielectric constant (F/cm) of the semiconductor used in the semiconductor device of the first preferred embodiment, q denotes the unit charge quantity (C), $N_d$ denotes the impurity concentration (cm⁻³) of the n⁻ semiconductor layer 3, and $N_a$ denotes the impurity concentration (cm⁻³) of the p⁺ impurity region 4.

The above expression (1) is a conditional expression where the end portion on the drain side of the n⁻ semiconductor layer 3 in the slit region 105 enters a pinch-off state in charging the bootstrap capacity element 200. As a result, the JFET 102 functions as a current limiting resistor against the charging current, whereby the current capacity required for the voltage source 150L can be reduced. The reason for this is explained below.

Figure 6:
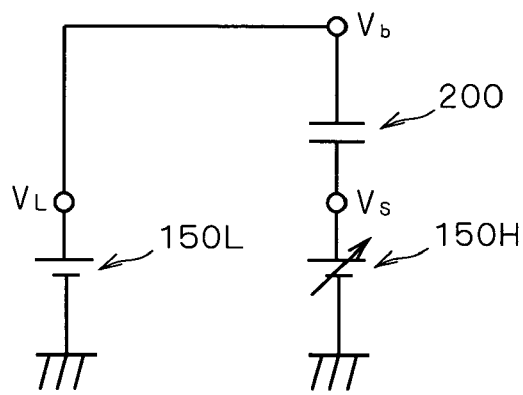
FIG. 6 shows a circuit diagram of the semiconductor device according to the first preferred embodiment where a voltage source and a bootstrap capacity element are directly connected.
Figure 7:
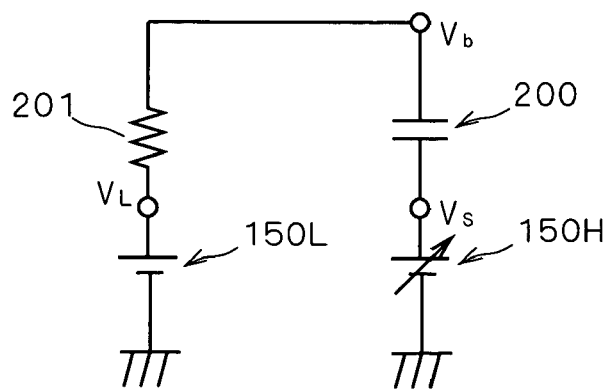
FIG. 7 shows a circuit diagram of the semiconductor device according to the first preferred embodiment where the voltage source and the bootstrap capacity element are connected through a limiting resistor.
Figure 8A:
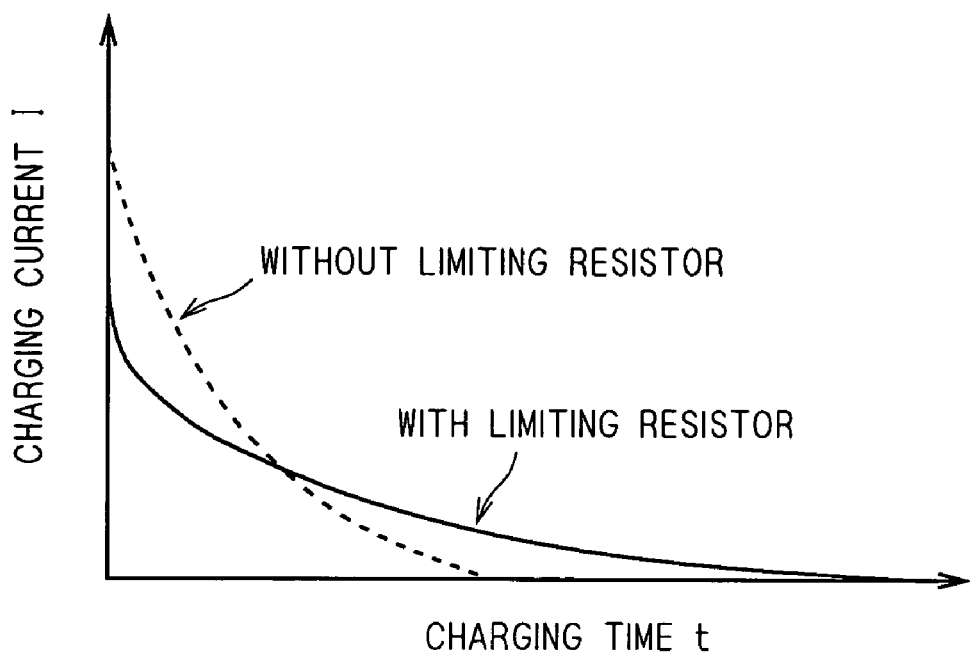
FIGS. 8A and 8B illustrate charging characteristics in charging the bootstrap capacity element.
Figure 8B:
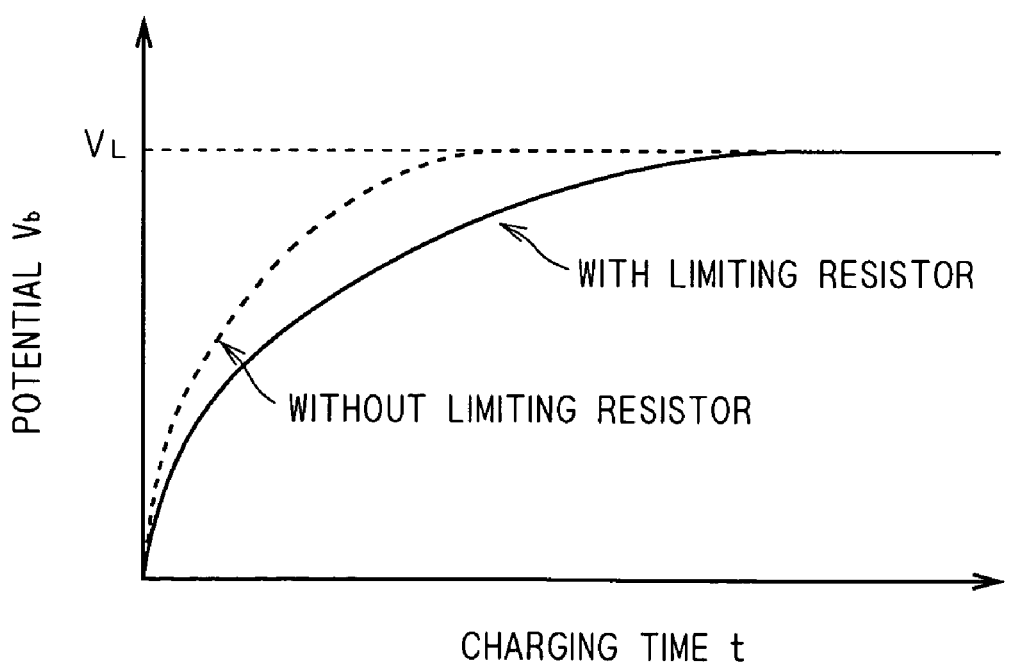

FIG. 6 shows a circuit diagram of the semiconductor device of the first preferred embodiment where the voltage source 150L and the bootstrap capacity element 200 are directly connected without providing the JFET 102, and FIG. 7 shows a circuit diagram where a current limiting resistor 201 is provided instead of the JFET 102. FIGS. 8A and 8B illustrate the charging characteristics of the circuits shown in FIGS. 6 and 7, FIG. 8A illustrating the relationship between a charging current I and charging time t with respect to the bootstrap capacity element 200 and FIG. 8B illustrating the relationship between the potential $V_b$ and the charging time t. For simplicity's sake, the logic circuit 103 is not shown in FIGS. 6 and 7. The broken lines and solid lines in FIGS. 8A and 8B indicate the characteristics of the circuits shown in FIGS. 6 and 7, respectively.

When the voltage source 150L and the bootstrap capacity element 200 are directly connected as shown in FIG. 6, the charging current right after the start of charging (hereinafter referred to as an "initial charging current") is remarkably large as shown in FIG. 8A. Because of this, the voltage source 150L having a large current capacity needs to be used in this case in order to prevent a possible reduction in the output potential $V_L$ at the voltage source 150L when the initial charging current flows. Since the output potential $V_L$ is used as the positive power supply of the low breakdown voltage circuit not shown, as discussed above, the reduction thereof may cause the low breakdown voltage circuit to malfunction. Therefore, the voltage source 150L having a large capacity needs to be prepared to prevent the reduction.

On the other hand, when the voltage source 150L and the bootstrap capacity element 200 are connected through the current limiting resistor 201 as shown in FIG. 7, the initial charging current can be reduced as shown in FIG. 8A. Thus the voltage source 150L having a smaller current capacity than when they are directly connected can be used in this case. This means that the JFET 102's functioning as a current limiting resistor can reduce the current capacity of the voltage source 150L.

Figure 9A:
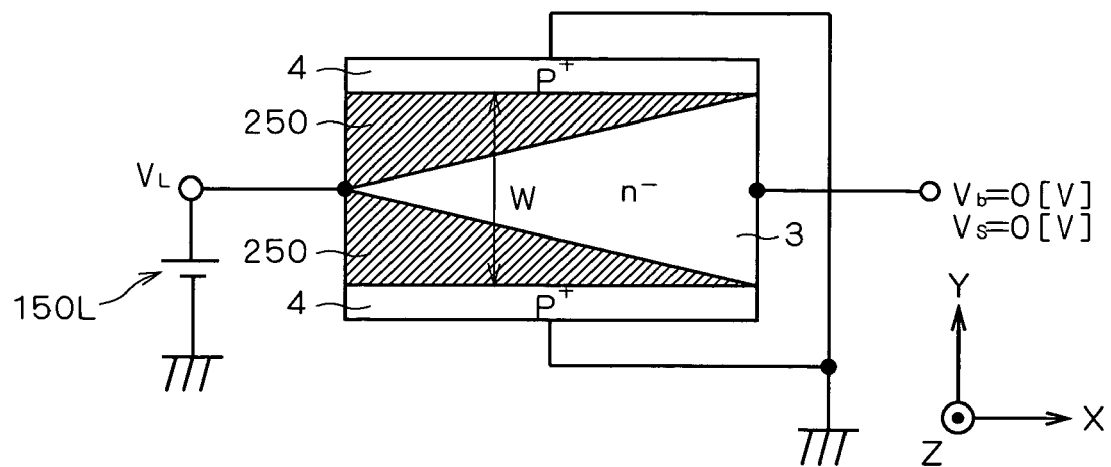
FIGS. 9A to 9C show how a depletion layer is formed.
Figure 9B:
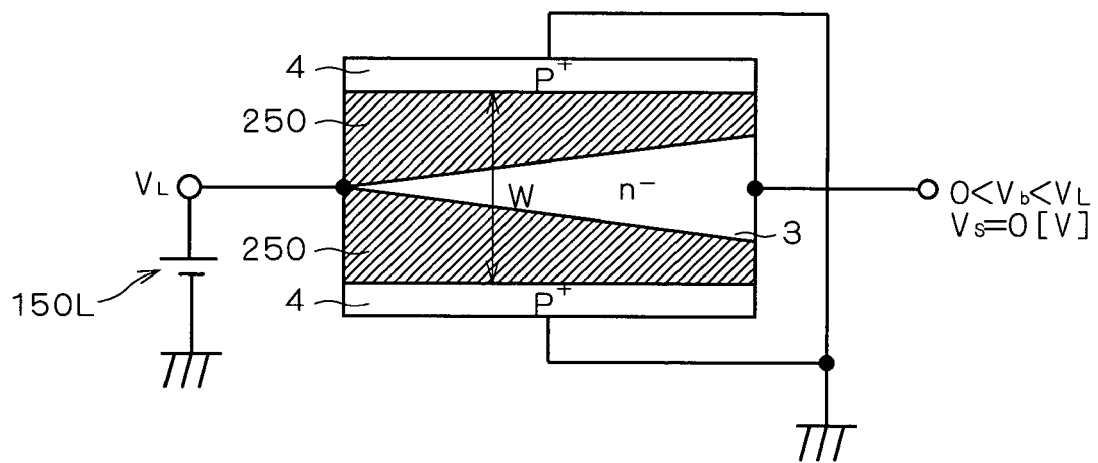
Figure 9C:
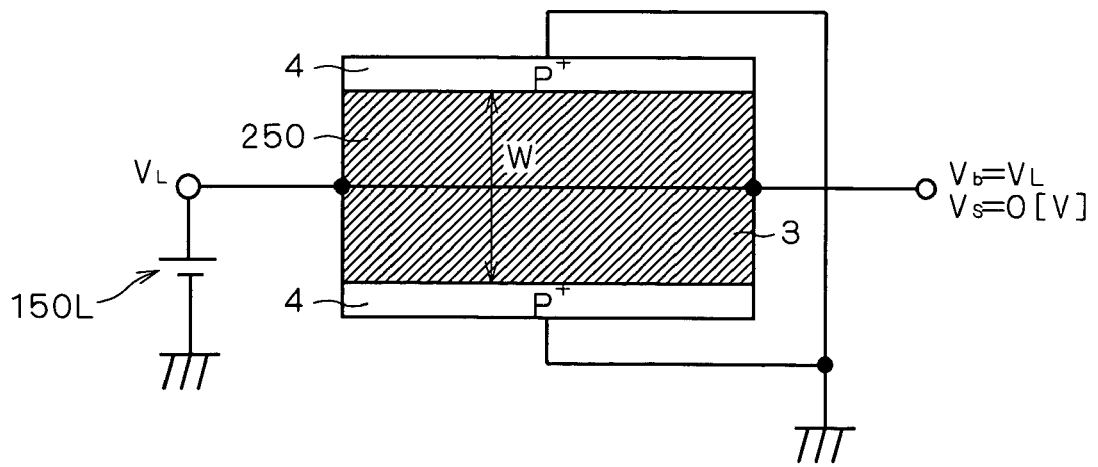

FIG. 9 shows how the depletion layer is formed in the n⁻ semiconductor layer 3 in the slit region 105 in charging the bootstrap capacity element 200, which is a plan view from above of the n⁻ semiconductor layer 3. FIG. 9A shows a stage where $V_b=0V$, i.e. when the charging to the bootstrap capacity element 200 starts, FIG. 9B shows a stage where $0<V_b<V_L$, i.e. the period during which the charging starts and completes, and FIG. 9C shows a stage where $V_b=V_L$, i.e. when the charging has completed.

At the start of charging, as shown in FIG. 9A, depletion layers 250 extend from the p⁺ impurity region 4 sandwiching the n⁻ semiconductor layer 3 in the direction of the Y axis at the end portion on the drain side of the n⁻ semiconductor layer 3 in the slit region 105, and come into contact with each other to enter the pinch-off state. This allows the JFET 102 to function as a current limiting resistor at the start of charging. Then, after the electric charge is accumulated in the bootstrap capacity element 200 and the potential $V_b$ increases, as shown in FIG. 9B, the depletion layers 250 also extend from the p⁺ impurity region 4 at the end portion on the source side of the n⁻ semiconductor layer 3 in the slit region 105.

In this way, the depletion layers 250 are also formed at the end portion on the source side of the n⁻ semiconductor layer 3 in the slit region 105 as the charging to the bootstrap capacity element 200 proceeds, which involves an increase in impedance of the channel of the JFET 102. However, the impedance increase does not affect the charging time very much because the required charging current I decreases as the charging time t passes as shown in FIG. 8A.

Then, when $V_b$ increases to $V_L$, as shown in FIG. 9C, the depletion layers 250 are formed across the whole n⁻ semiconductor layer 3 in the slit region 105. Therefore, even when the potential $V_S$ is set at the potential $V_H$ afterward and the potential $V_b$ becomes higher than the potential $V_L$, the accumulated electric charge in the bootstrap capacity element 200 hardly flows toward the n⁻ semiconductor layer 3 in the low-potential island region 104, thereby maintaining the potential $V_b$ at ($V_L+V_H$) reliably.

In such ways, the JFET 102 functions as a current limiting resistor by setting the width W of the n⁻ semiconductor layer 3 in the slit region 105 to satisfy the expression (1), whereby the current capacity required for the voltage source 150L that supplies a potential to the n⁻ semiconductor layer 3 in the low-potential island region 104 can be reduced. Moreover, because the n⁻ semiconductor layer 3 in the slit region 105 is completely covered with the depletion layer when $V_b$ increases to $V_L$, the leakage of the accumulated electric charge in the bootstrap capacity element 200 can be reduced while reliably increasing the potential $V_b$ at the one end 200a of the bootstrap capacity element 200 to the potential $V_L$.

Second Preferred Embodiment

Figure 10:
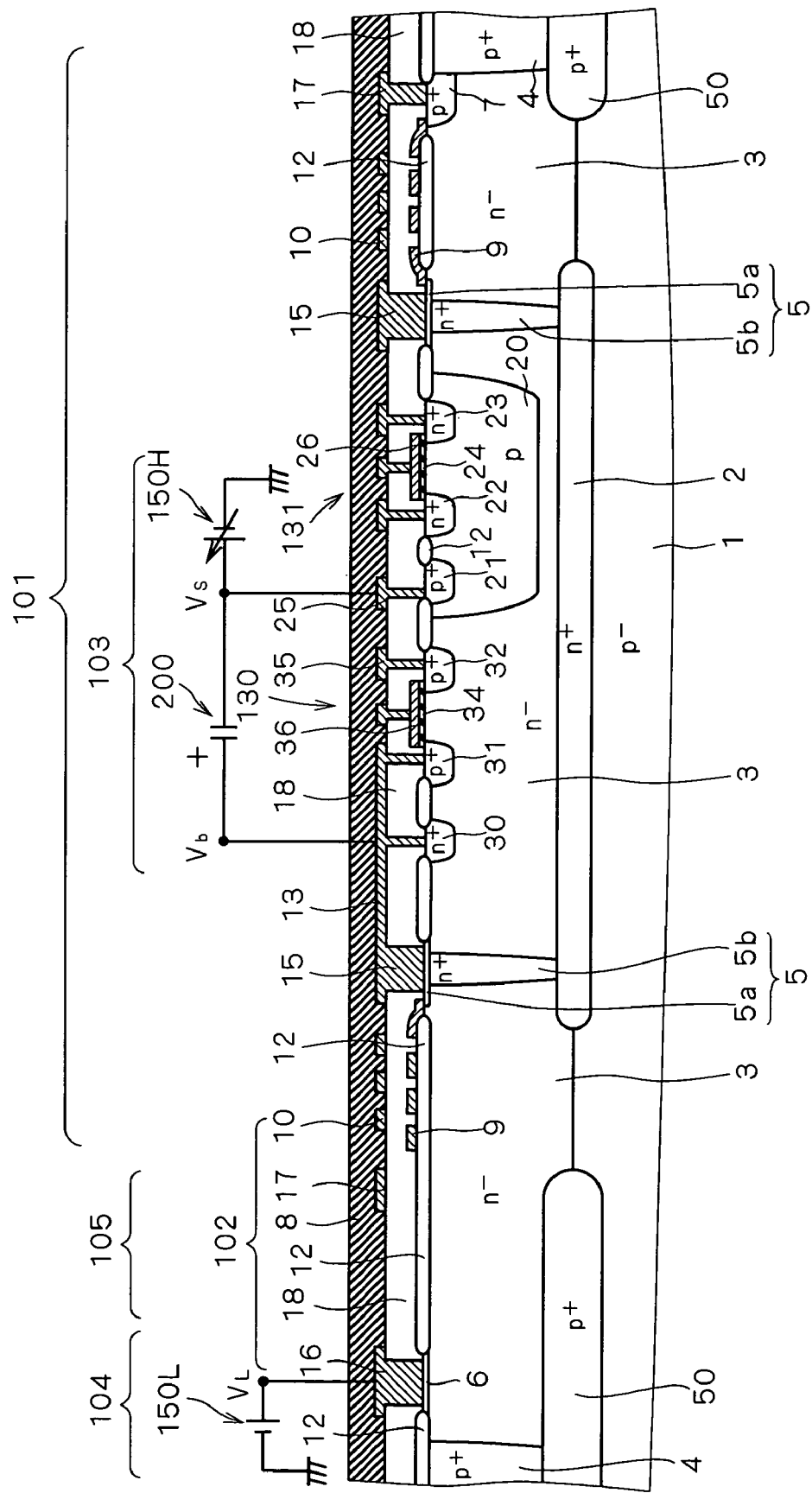
FIGS. 10 to 12 are cross-sectional views of a semiconductor device structure according to a second preferred embodiment of this invention.
Figure 11:
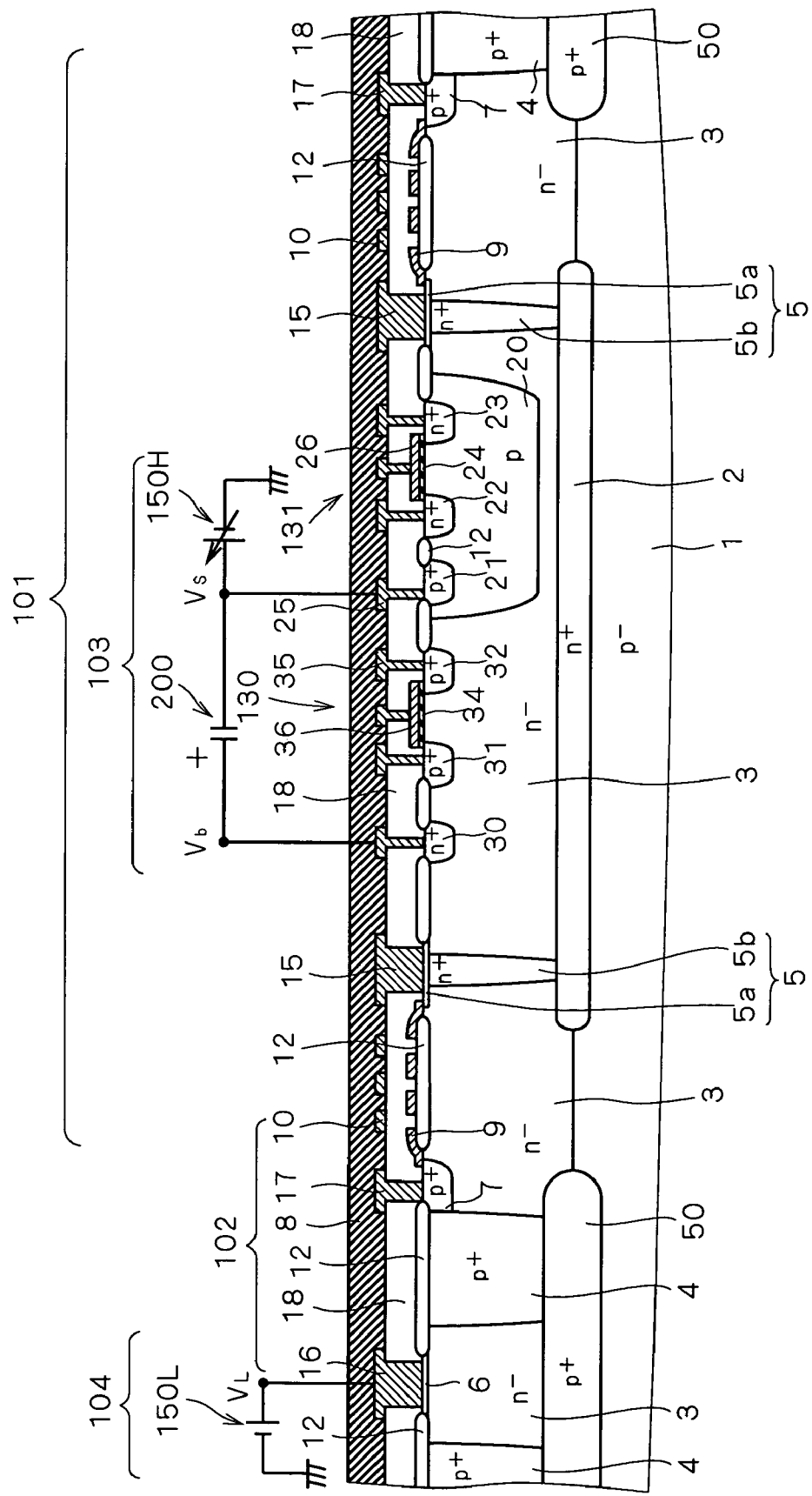
Figure 12:
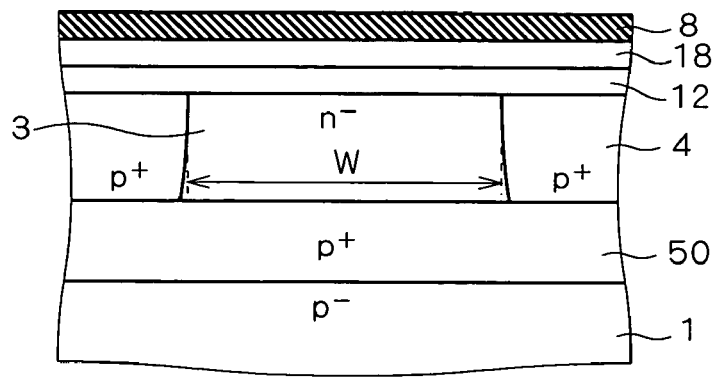

FIGS. 10 to 12 are cross-sectional views of a semiconductor device structure according to a second preferred embodiment of this invention. FIGS. 10 to 12 are cross-sectional views taken along the lines A-A to C-C indicated by the arrows in FIG. 2, respectively. The semiconductor device of the second preferred embodiment is a modification of that of the aforementioned first preferred embodiment which basically further includes a p⁺ buried impurity region 50.

As shown in FIGS. 10 to 12, the p⁺ buried impurity region 50 is formed at the interface between the n⁻ semiconductor layer 3 and the p⁻ semiconductor substrate 1 to surround the n⁺ buried impurity region 2. Specifically, the p⁺ buried impurity region 50 is formed at the interface between the periphery of the n⁻ semiconductor layer 3 and the p⁻ semiconductor substrate 1 in the high-potential island region 101, and at the interfaces between the n⁻ semiconductor layers 3 and the p⁻ semiconductor substrate 1, the n⁻ semiconductor layers 3 being in other than the high-potential island region 101 and including those in the low-potential island region 104 and the slit region 105, to surround the n⁺ buried impurity region 2. Unlike the first preferred embodiment, the p⁺ impurity region 4 is formed to reach the p⁺ buried impurity region 50. The other components of the structure are identical to those of the semiconductor device of the first preferred embodiment and thus the description thereof will be omitted.

As discussed above, in the semiconductor device of the second preferred embodiment, the p⁺ buried impurity region 50 connected to the p⁺ impurity region 4 and having a higher impurity concentration than the n⁻ semiconductor layer 3 is provided at the interface between the n⁻ semiconductor layer 3 and the p⁻ semiconductor substrate 1 in the slit region 105. Accordingly, the application of a reverse voltage to a pn junction formed of the p⁺ impurity region 4, the p⁺ buried impurity region 50 and the n⁻ semiconductor layer 3 causes depletion layers to extend to a large extent toward the n⁻ semiconductor layer 3 in the slit region 105 from the p⁺ impurity region 4 sandwiching the n⁻ semiconductor layer 3 in the direction of the Y axis as well as from the p⁺ buried impurity region 50. This improves the impedance of the channel of the JFET 102 during the operation of the semiconductor device. Therefore, the leakage of the accumulated electric charge in the bootstrap capacity element 200 when the potential $V_b$ becomes higher than the potential $V_L$ can be further reduced.

Moreover, the p⁺ impurity region 4 of the second preferred embodiment, which is formed to reach the p⁺ buried impurity region 50, can be formed to diffuse shallower than the p⁺ impurity region 4 of the first preferred embodiment which is formed to reach the interface between the n⁻ semiconductor layer 3 and the p⁻ semiconductor substrate 1. Therefore, variations in the width W of the n⁻ semiconductor layer 3 in the slit region 105 can be minimized among a plurality of semiconductor devices.

The leakage of the accumulated electric charge in the bootstrap capacity element 200 can be further reduced in the second preferred embodiment as well, by setting the width W of the n⁻ semiconductor layer 3 in the slit region 105 to satisfy the aforementioned expression (1).

Third Preferred Embodiment

Figure 13:
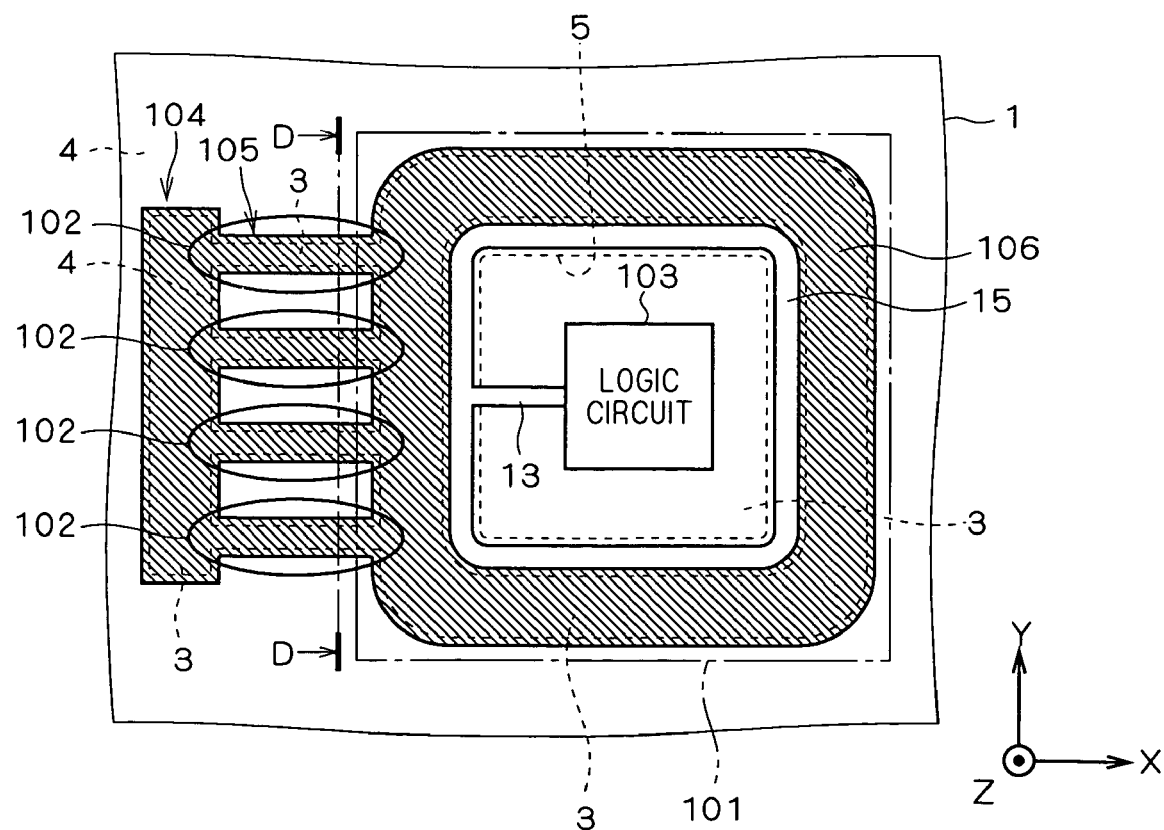
FIG. 13 is a plan view of a semiconductor device structure according to a third preferred embodiment of this invention.

FIG. 13 is a schematic plan view of a semiconductor device structure according to a third preferred embodiment of this invention, and FIG. 14 is a cross-sectional view taken along the line D-D indicated by the arrows in FIG. 13. The semiconductor device of the third preferred embodiment is a modification of that of the aforementioned first preferred embodiment which includes a plurality of slit regions 105.

As shown in FIGS. 13 and 14, the p⁺ impurity region 4 of the third preferred embodiment is formed to surround part of the n⁻ semiconductor layer 3 and defines the high-potential island region 101, the low-potential island region 104 and the plurality of slit regions 105. Each of the n⁻ semiconductor layers 3 in the plurality of slit regions 105 is positioned between the n⁻ semiconductor layers 3 in the high-potential island region 101 and the low-potential island region 104 and is connected to both. The other components of the structure are identical to those of the semiconductor device of the first preferred embodiment and thus the description thereof will be omitted.

As such, in the semiconductor device of the third preferred embodiment where the plurality of slit regions 105 are provided, a plurality of parasitic JFETs 102 are provided. Thus the bootstrap capacity element 200 can be charged with the plurality of JFETs 102 connected in parallel. Therefore, even when a sufficient charging current cannot be supplied with one JFET 102 due to high impedance of the channel thereof and so on, the plurality of JFETs 102 can be provided according to the capacitance of the bootstrap capacity element 200, thereby reducing the charging time.

The leakage of the accumulated electric charge in the bootstrap capacity element 200 can be further reduced in the third preferred embodiment as well, by setting the width W of the n⁻ semiconductor layer 3 in each of the slit regions 105 to satisfy the aforementioned expression (1). It is particularly effective to form the plurality of JFETs 102 by providing the plurality of slit regions 105 as in the third preferred embodiment, because in such case, the charging current to the bootstrap capacity element 200 is remarkably limited due to a pinch-off effect.

Like the one of the third preferred embodiment, the semiconductor device of second preferred embodiment may include the plurality of slit regions 105. FIG. 15 is a cross-sectional view in such case taken along the line D-D indicated by the arrows in FIG. 13.

Fourth Preferred Embodiment

Figure 17:
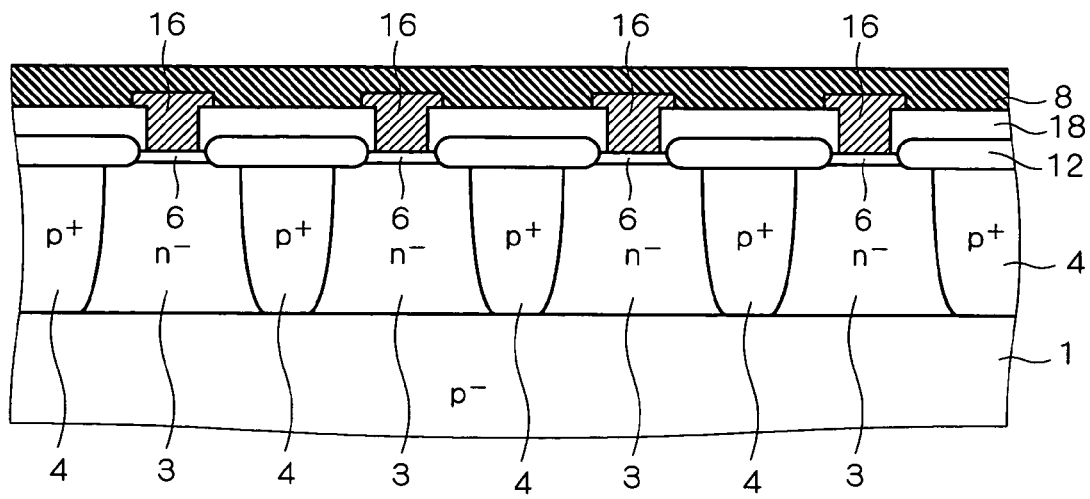
FIG. 17 is a cross-sectional view of the semiconductor device structure according to the fourth preferred embodiment.

FIG. 16 is a schematic plan view of a semiconductor device structure according to a fourth preferred embodiment of this invention, and FIG. 17 is a cross-sectional view taken along the line E-E indicated by the arrows in FIG. 16. The semiconductor device of the fourth preferred embodiment is a modification of that of the aforementioned third preferred embodiment which basically divides the low-potential island region 104 into a plurality of regions.

As shown FIGS. 16 and 17, the low-potential island region 104 of the fourth preferred embodiment is divided into a plurality of divided regions 104a. In short the p$^+$ impurity region 4 of the fourth preferred embodiment defines the plurality of divided regions 104a in the n$^-$ semiconductor layer 3. The n$^-$ semiconductor layers 3 in the plurality of divided regions 104a are connected to the n$^-$ semiconductor layers 3 in the plurality of slit regions 105 one-on-one. The n$^+$ impurity region 6 and the electrode 16 are independently provided for each of the divided regions 104a.

Further in the semiconductor device of the fourth preferred embodiment, a plurality of switch circuits SW are provided. One ends of the switch circuits SW are electrically connected to the plurality of electrodes 16 one-on-one, and the other ends thereof to the voltage source 150L.

The switch circuits SW are fixed beforehand in the ON state or OFF state. The ON/OFF state of the switch circuits SW can be fixed beforehand by, for example, forming the switch circuits SW with a plurality of electrode terminals connected to the plurality of electrodes 16 one-on-one, electrode terminals connected to the voltage source 150L, and aluminum wires connecting them, and by performing wire bonding or not in an assembly process.

Alternatively, the ON/OFF state of the switch circuits SW can be fixed beforehand by forming the switch circuits SW with a plurality of electrode terminals connected to the plurality of electrodes 16 one-on-one, electrode terminals connected to the voltage source 150L, and a plurality of wirings independently connecting them, and by cutting the wirings or not with a laser or the like in an assembly process.

Alternatively, semiconductor switches may be employed as the switch circuits SW. In that case, the configuration should be such that a ROM is formed in a wafer process and the semiconductor switches are controllable by information written into the ROM. Then, ON/OFF information about the semiconductor switches is written into the ROM in a subsequent test process, thereby fixing the ON/OFF state of each of the semiconductor switches beforehand. The switch circuits SW and the ROM are provided on the aforementioned low breakdown voltage circuit. The other components of the structure are identical to those of the semiconductor device of the third preferred embodiment and thus the description thereof will be omitted.

In such ways, in the semiconductor device of the fourth preferred embodiment where the low-potential island region 104 includes the plurality of divided regions 104a, and the n$^-$ semiconductor layers 3 in the plurality of divided regions 104a are connected to the n$^-$ semiconductor layers 3 in the plurality of slit regions 105 one-on-one, the provision of the switch circuits SW gives freedom of choice among the plurality of JFETs 102 to be used for charging the bootstrap capacity element 200 in a process that follows a wafer process e.g. in an assembly process or test process. Therefore, a plurality of semiconductor devices that support the bootstrap capacity elements 200 having different capacitances can be manufactured by using the same wafer process, thereby reducing manufacturing costs.

Fifth Preferred Embodiment

Figure 18:
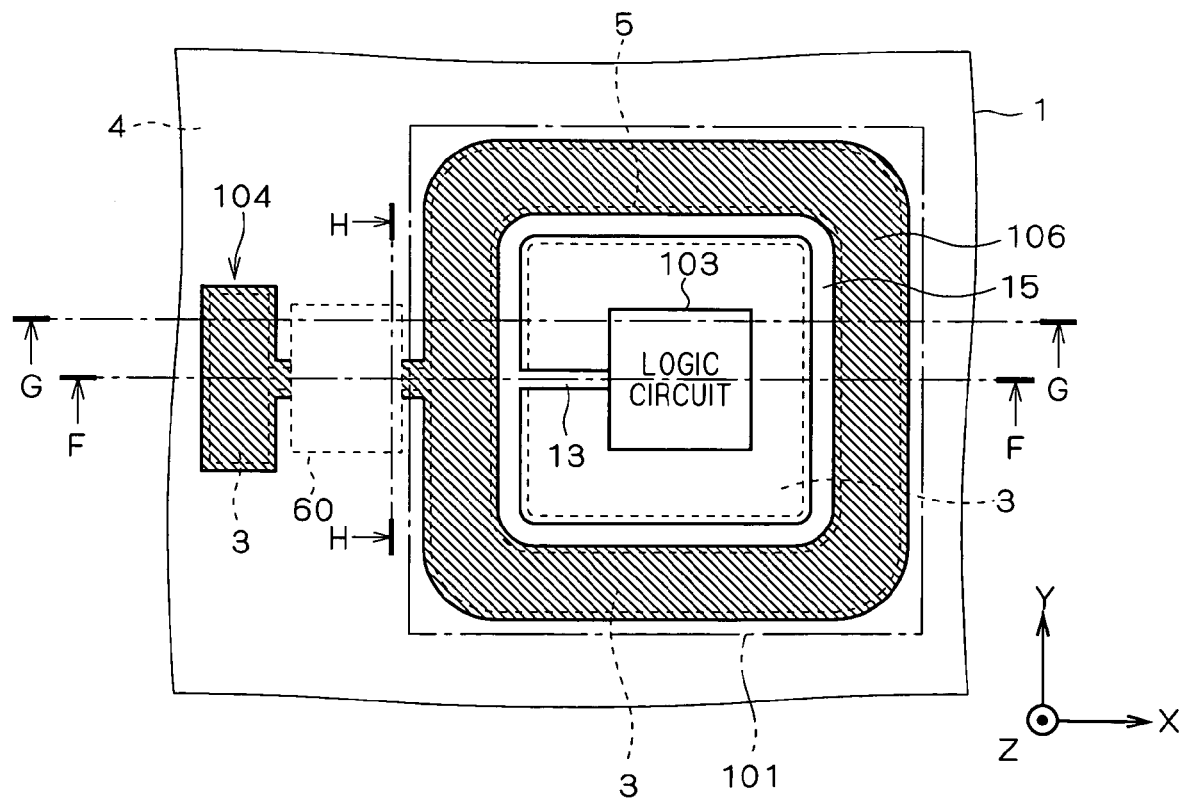
FIG. 18 is a plan view of a semiconductor device structure according to a fifth preferred embodiment of this invention.
Figure 19:
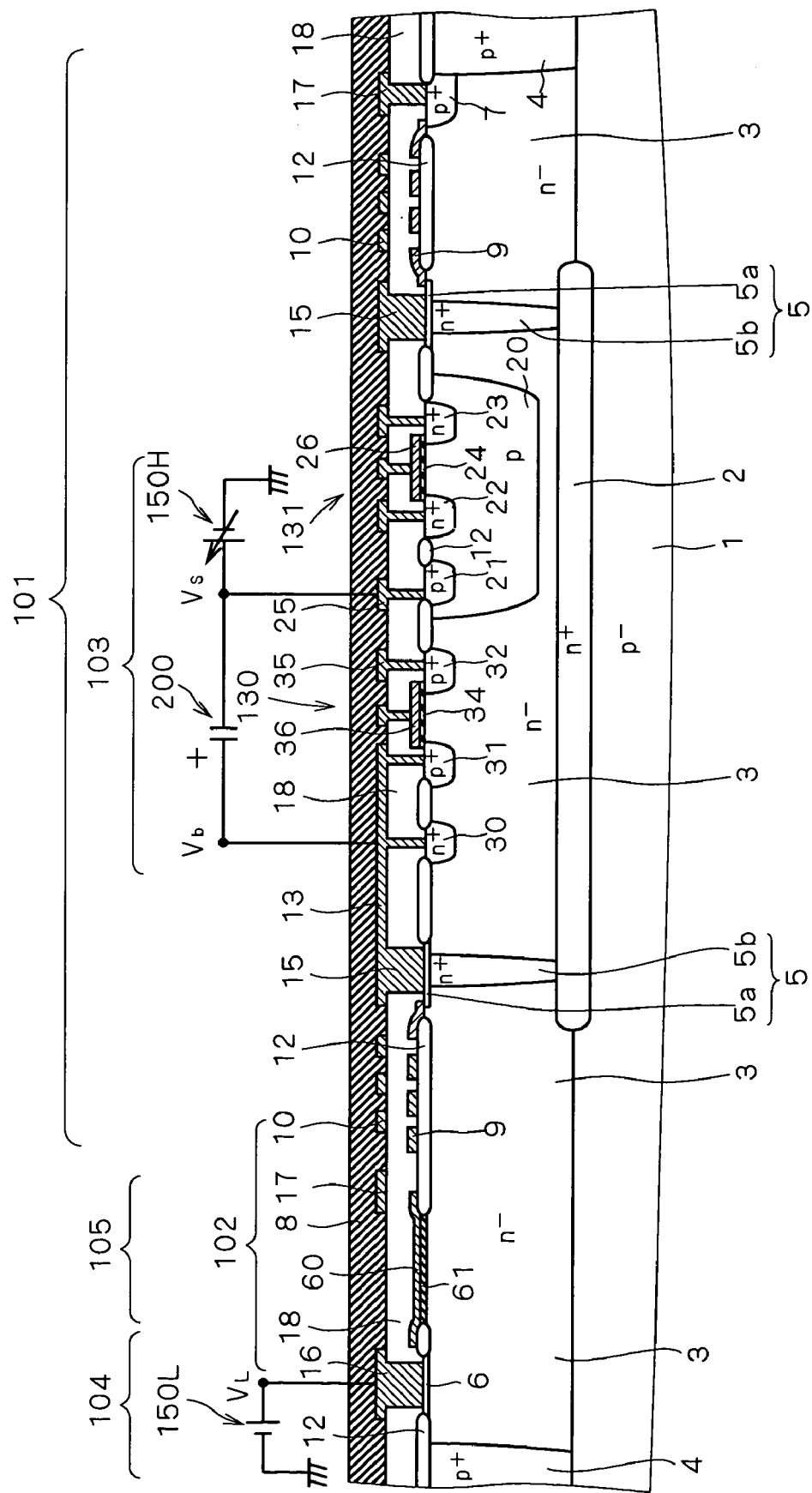
FIGS. 19 to 21 are cross-sectional views of the semiconductor device structure according to the fifth preferred embodiment.
Figure 20:
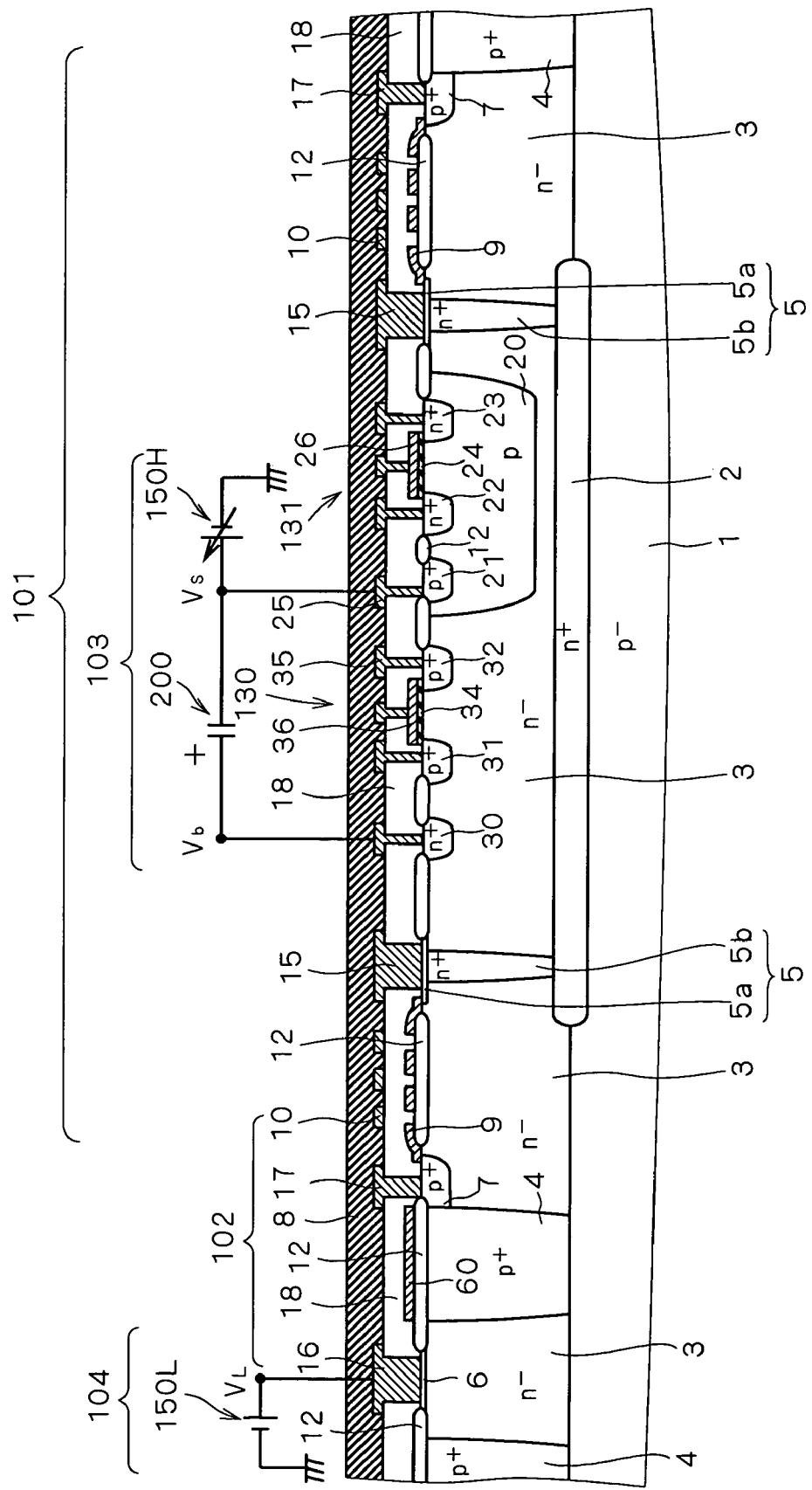
Figure 21:
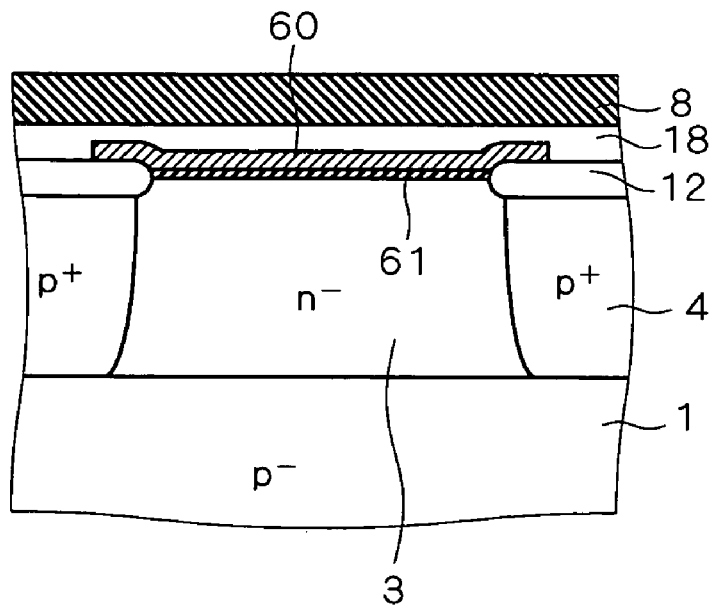

FIG. 18 is a schematic plan view of a semiconductor device structure according to a fifth preferred embodiment of this invention. FIGS. 19 to 21 are cross-sectional views taken along the lines F-F to H-H indicated by the arrows in FIG. 18, respectively. The semiconductor device of the fifth preferred embodiment is a modification of that of the aforementioned first preferred embodiment which basically further includes a gate electrode 60 and a gate insulating film 61.

As shown in FIGS. 18 to 21, the gate insulating film 61 that is much thinner than the oxide film 12 is provided instead of the oxide film 12 on the n$^-$ semiconductor layer 3 in the slit region 105, and the gate electrode 60 is provided thereon. The gate electrode 60 is also provided partially through the oxide film 12 on the p$^+$ impurity region 4 sandwiching the n$^-$ semiconductor layer 3 in the slit region 105 in the direction of the Y axis.

The gate electrode 60 is a conductive film made of polysilicon, for example. The gate insulating film 61 is made of a silicon oxide film, for example. The other components of the structure are identical to those of the semiconductor device of the first preferred embodiment and thus the description thereof will be omitted.

In such ways, in the semiconductor device of the fifth preferred embodiment where the gate electrode 60 is provided through the gate insulating film 61 on the n$^-$ semiconductor layer 3 in the slit region 105, the application of a positive potential to the gate electrode 60 leads to the formation of an accumulation layer near the upper surface of the n$^-$ semiconductor layer 3 in the slit region 105. This improves the mobility of electrons in the cannel of the JFET 102. Consequently, the charging current to the bootstrap capacity element 200 increases to complete the charging in a short time.

Figure 22:
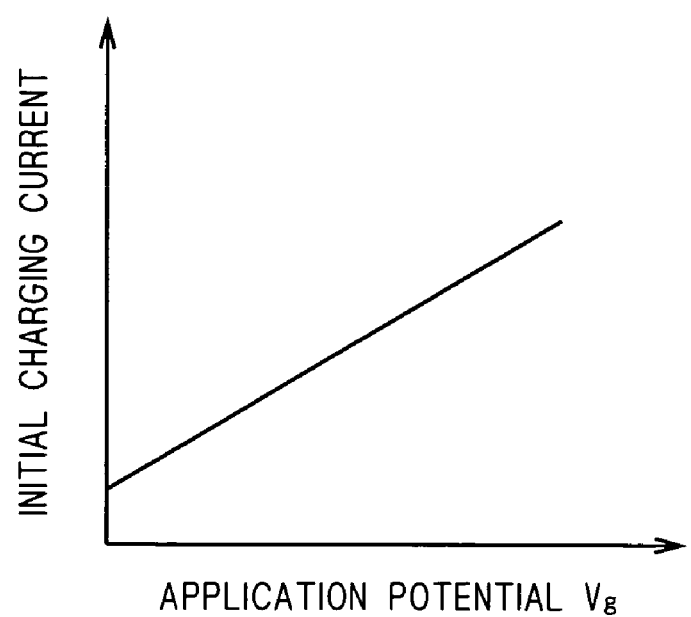
FIG. 22 shows the relationship between an application potential $V_g$ and an initial charging current.

When an application potential $V_g$ to the gate electrode 60 increases, the mobility of electrons is improved in the n$^-$ semiconductor layer 3 in the slit region 105, whereby the initial charging current increases. In short the initial charging current is controllable by the potential $V_g$ applied to the gate electrode 60. FIG. 22 shows the relationship between the application potential $V_g$ and the initial charging current, and explains that the initial charging current increases as the potential $V_g$ to the gate electrode 60 increases.

When the charging to the bootstrap capacity element 200 has completed and the potential $V_S$ is set at the potential $V_H$, the leakage of the accumulated electric charge in the bootstrap capacity element 200 can be reduced by applying a ground potential to the gate electrode 60. While the gate electrode 60 is provided partially through the oxide film 12 on the p$^+$ impurity region 4 as well, it is possible to prevent an inversion layer from being formed near the surface of the p$^+$ impurity region 4 by adjusting the thickness of the oxide film 12.

The semiconductor devices of the aforementioned third and fourth preferred embodiments can too improve the mobility of electrons in the channel of each JFET 102 to produce similar effects to the semiconductor device of the fifth preferred embodiment, by forming the gate insulating film 61 on the n$^-$ semiconductor layers 3 in the plurality of slit regions 105, providing the gate electrode 60 common to the plurality of slit regions 105 on the gate insulating films 61, and applying a positive potential to the gate electrode 60.

Sixth Preferred Embodiment

Figure 23:
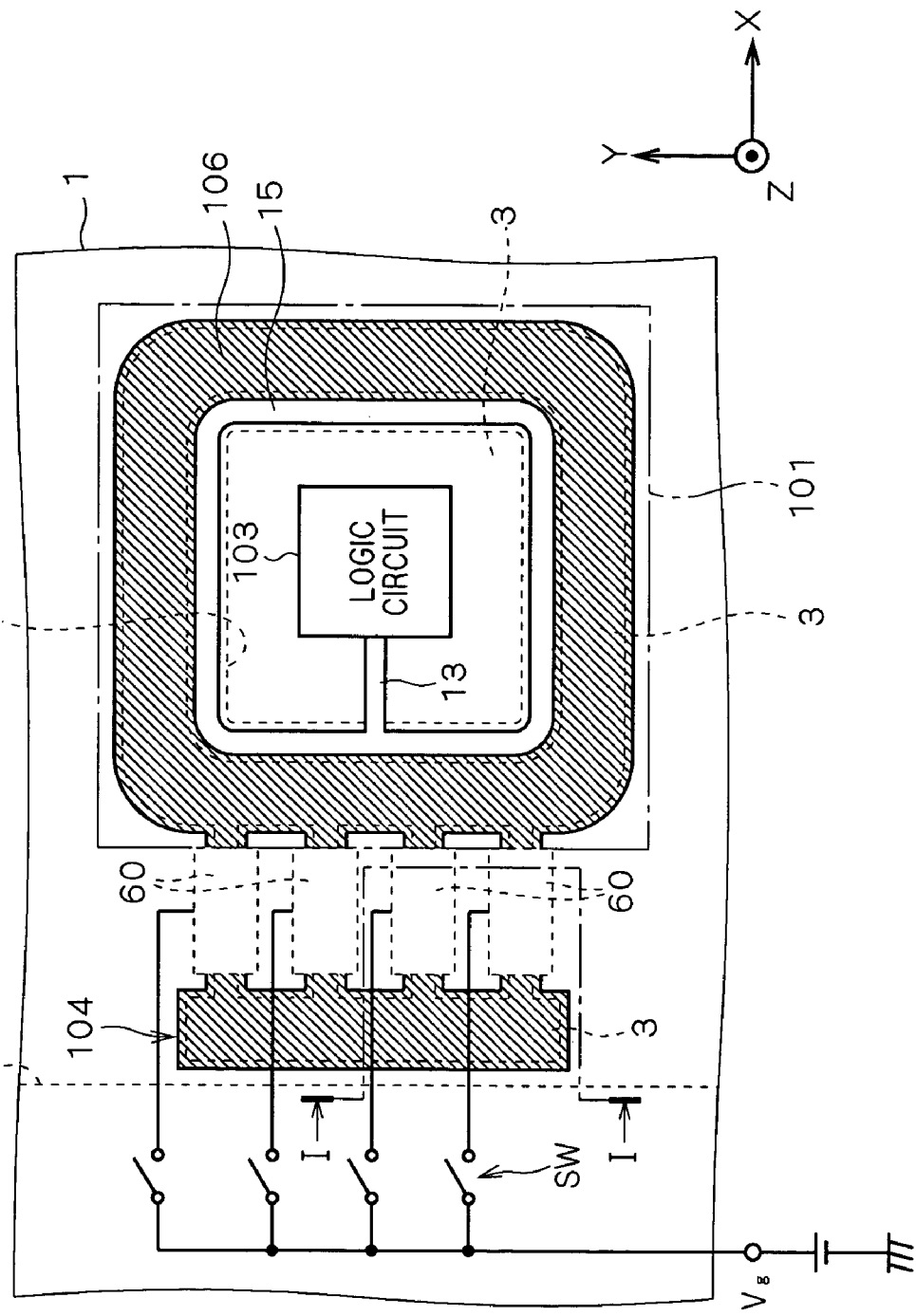
FIG. 23 is a plan view of a semiconductor device structure according to a sixth preferred embodiment of this invention.
Figure 24:
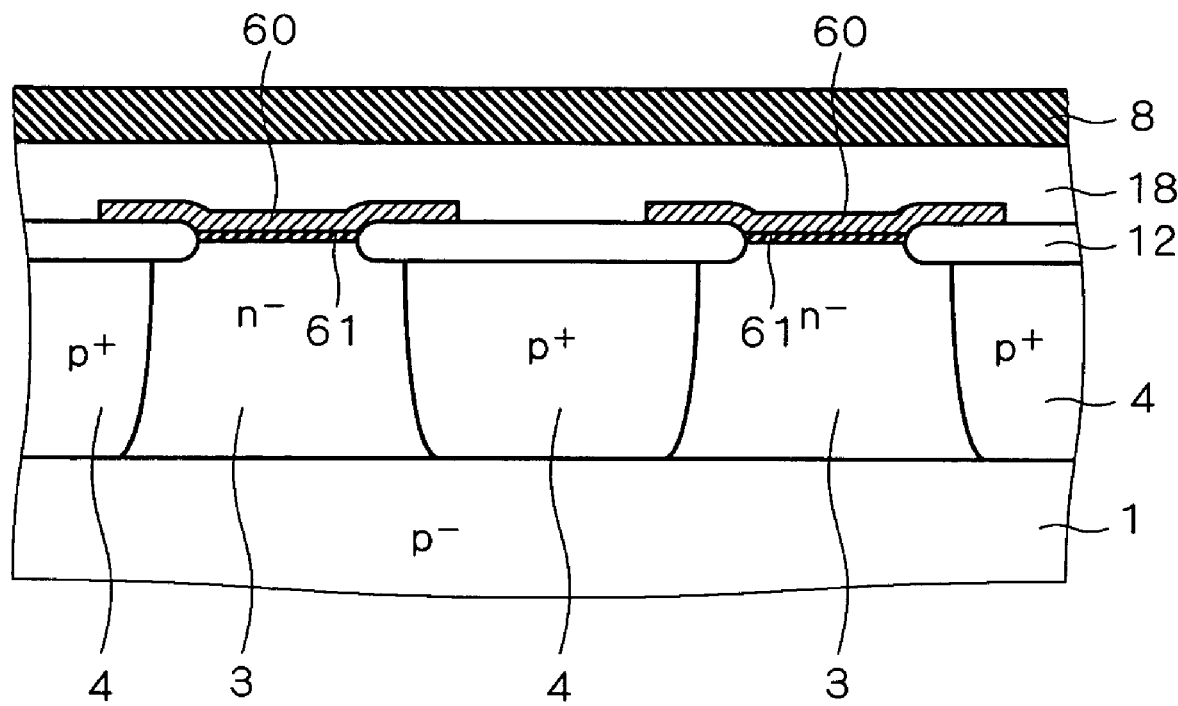
FIG. 24 is a cross-sectional view of the semiconductor device structure according to the sixth preferred embodiment.

FIG. 23 is a schematic plan view of a semiconductor device structure according to a sixth preferred embodiment of this invention. FIG. 24 is a cross-sectional view taken along the line I-I indicated by the arrows in FIG. 23. The semiconductor device of the sixth preferred embodiment is a modification of that of the aforementioned third preferred embodiment which basically includes the gate electrode 60 and the gate insulating film 61 for each of the slit regions 105.

As shown in FIGS. 23 and 24, the gate insulating films 61 are provided separately from one another on the respective n⁻ semiconductor layers 3 in the plurality of slit regions 105, and the gate electrodes 60 are provided separately from one another on the respective gate insulating films 61. In short the gate electrodes 60 are correspondingly provided one-on-one to the n⁻ semiconductor layers 3 in the plurality of slit regions 105.

The semiconductor device of the sixth preferred embodiment further includes the aforementioned plurality of switch circuits SW, the one ends of which are electrically connected to the plurality of gate electrodes 60 one-on-one, and the other ends of which are connected to the voltage source 150L. Like the fourth preferred embodiment, the plurality of switch circuits SW of the sixth preferred embodiment are independently determined to be in the ON state or OFF state in a process that follows a wafer process e.g. in an assembly process or test process.

In such ways, in the semiconductor device of the sixth preferred embodiment where the gate electrodes 60 are independently provided through the gate insulating films 61 on the respective n⁻ semiconductor layers 3 in the plurality of slit regions 105, the provision of the aforementioned switch circuits SW gives freedom of choice among the n⁻ semiconductor layers 3 in the plurality of slit regions 105 where an accumulation layer is to be formed, in a process that follows a wafer process e.g. in an assembly process or test process. In short a decision to improve the mobility of electrons in the channel of which JFET 102 can be made among the plurality of JFETs 102 after a wafer process. Therefore, a plurality of semiconductor devices that support the bootstrap capacity elements 200 having different capacitances can be manufactured by using the same wafer process, thereby reducing manufacturing costs.

Seventh Preferred Embodiment

Figure 25:
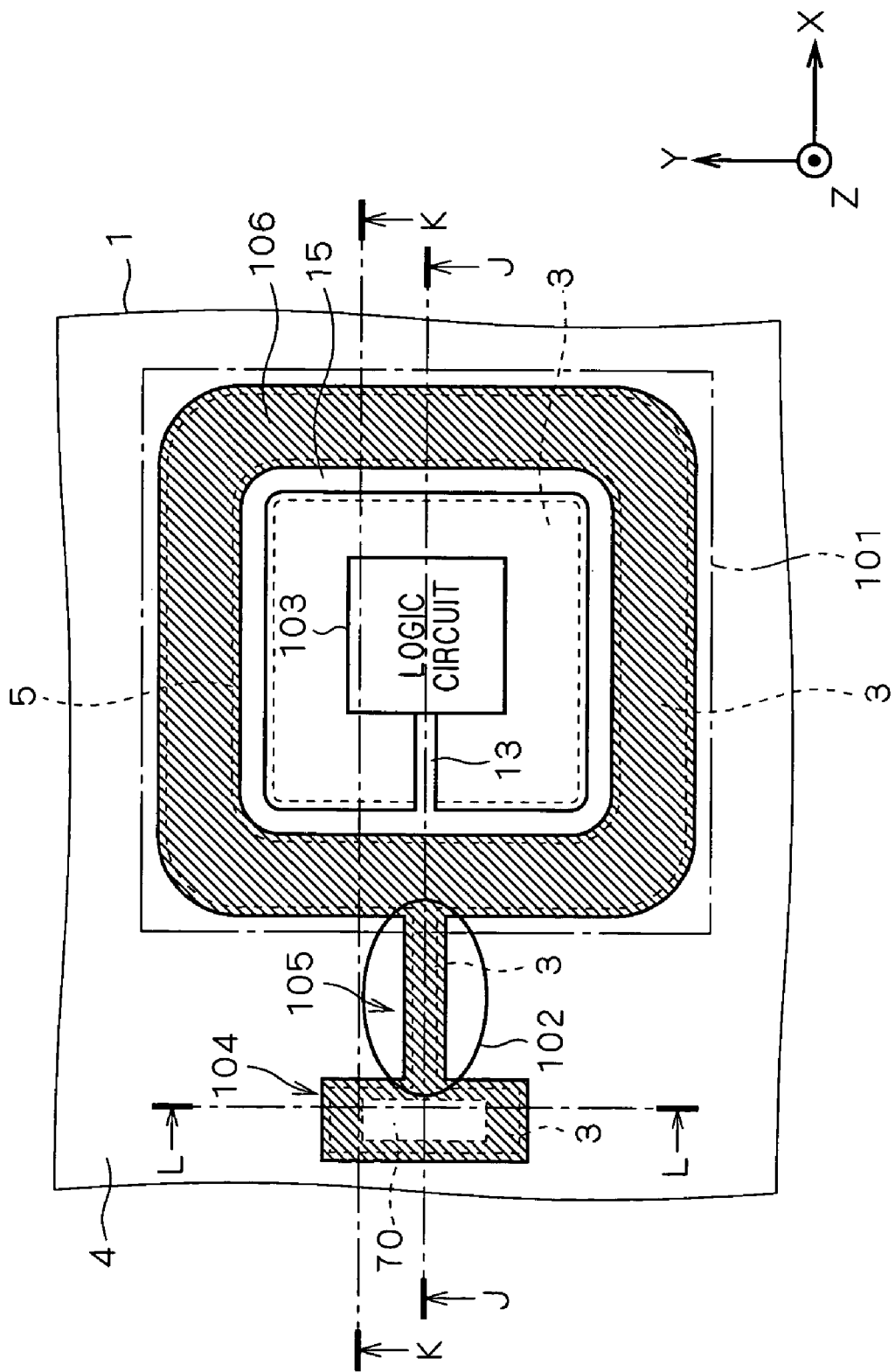
FIG. 25 is a plan view of a semiconductor device structure according to a seventh preferred embodiment of this invention.
Figure 26:
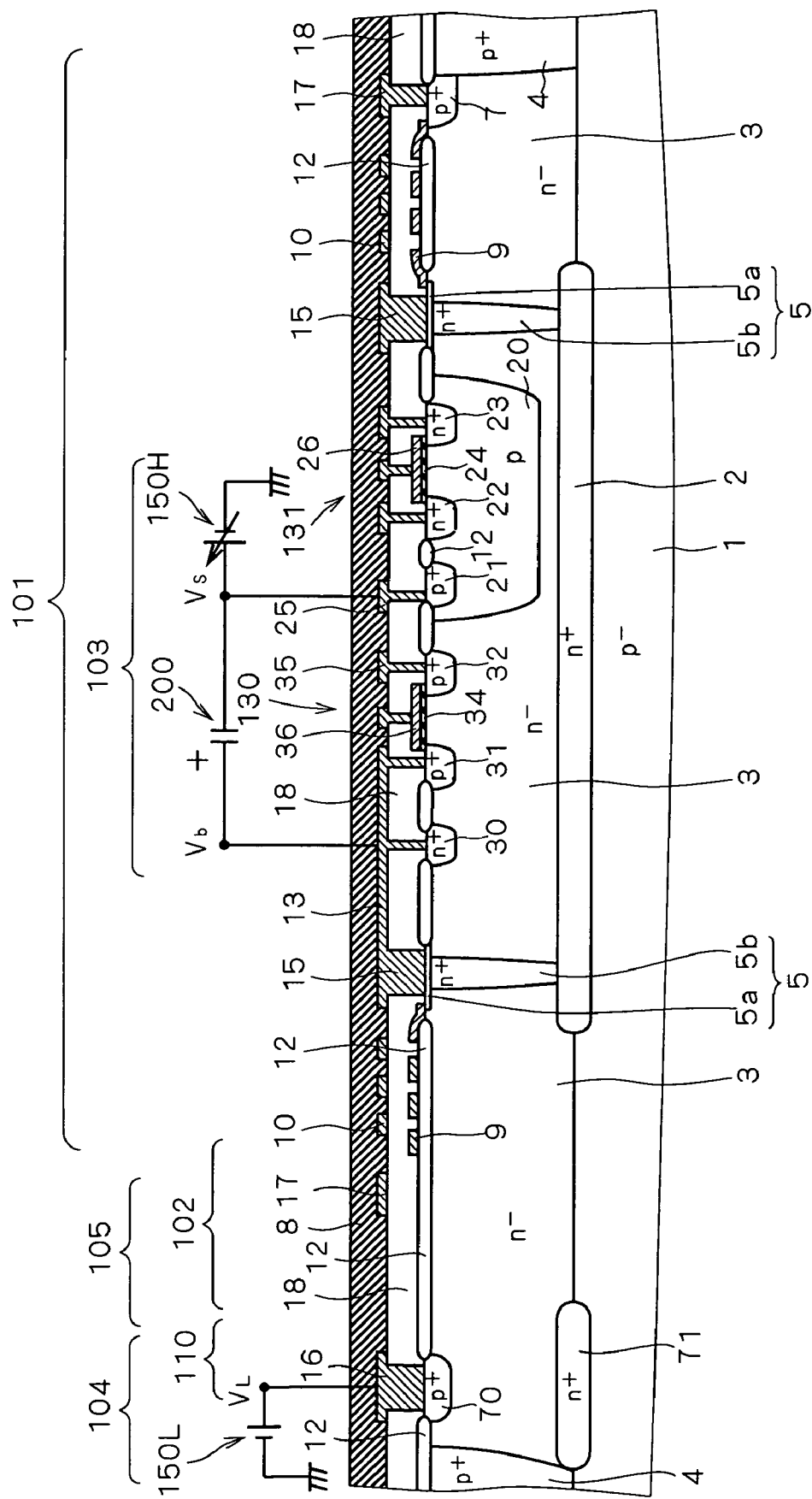
FIGS. 26 to 28 cross-sectional views of the semiconductor device structure according to the seventh preferred embodiment.
Figure 27:
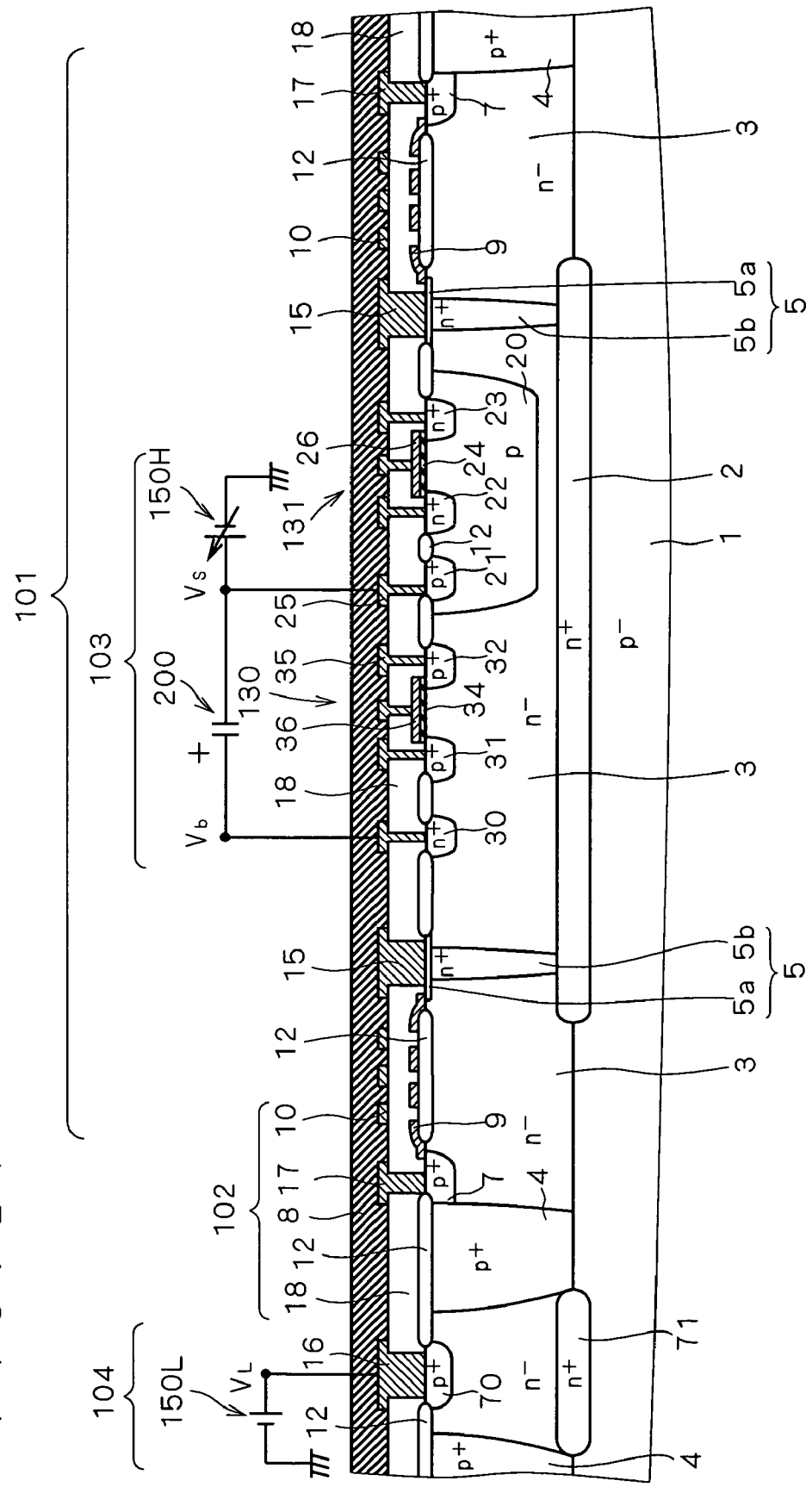
Figure 28:
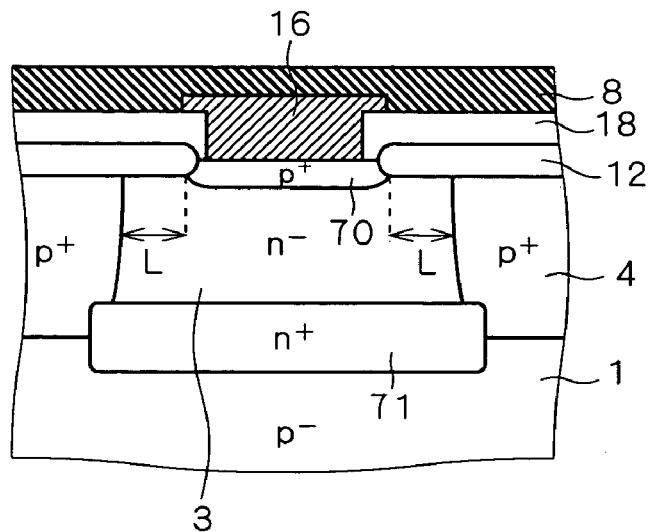

FIG. 25 is a schematic plan view of a semiconductor device structure according to a seventh preferred embodiment of this invention. FIGS. 26 to 28 are cross-sectional views taken along the lines J-J to L-L indicated by the arrows in FIG. 25, respectively. The semiconductor device of the seventh preferred embodiment is a modification of that of the aforementioned first preferred embodiment which includes a p⁺ impurity region 70 instead of the n⁺ impurity region 6 and further includes an n⁺ buried impurity region 71.

As shown in FIGS. 25 to 28, the p⁺ impurity region 70 is provided apart from the p⁺ impurity region 4 in the upper surface of the n⁻ semiconductor layer 3 in the low-potential island region 104. The electrode 16 is connected to the p⁺ impurity region 70. The n⁺ buried impurity region 71 is provided at the interface between the n⁻ semiconductor layer 3 and the p⁻ semiconductor substrate 1 in the low-potential island region 104 below the p⁺ impurity region 70. The other components of the structure are identical to those of the semiconductor device of the first preferred embodiment and thus the description thereof will be omitted.

As discussed above, in the semiconductor device of the seventh preferred embodiment, the p⁺ impurity region 70 is provided as connected to the electrode 16 to which the potential $V_L$ is applied, in the upper surface of the n⁻ semiconductor layer 3 in the low-potential island region 104. Thus the p⁺ impurity region 70 and the n⁻ semiconductor layer 3 in contact thereto form a pn junction diode.

Figure 29:
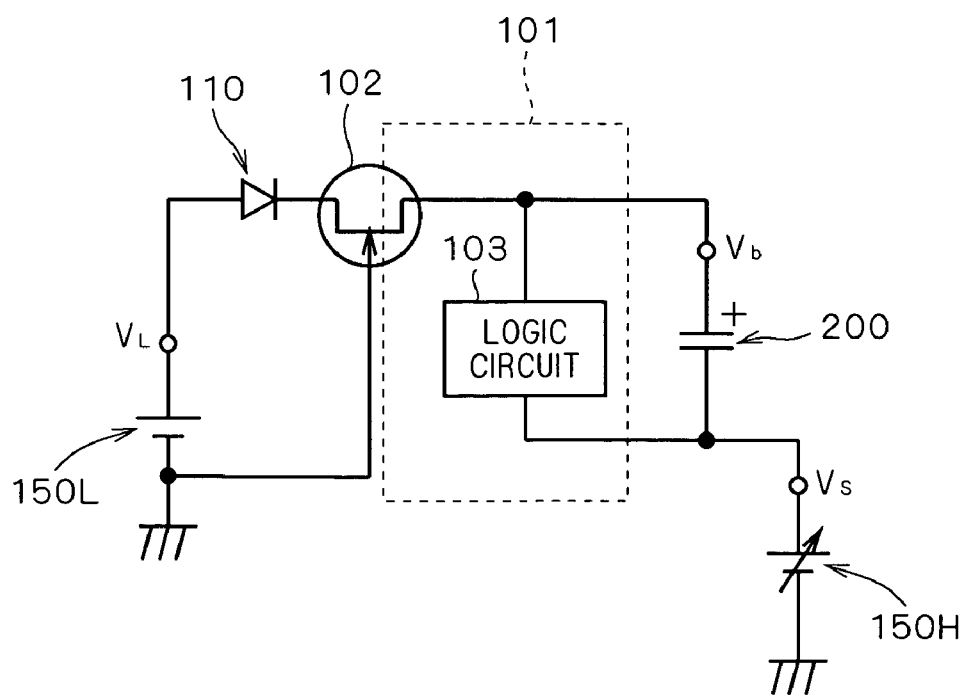
FIG. 29 shows an equivalent circuit of the semiconductor device according to the seventh preferred embodiment.

FIG. 29 shows an equivalent circuit of the semiconductor device of the seventh preferred embodiment. As shown in FIG. 29, the provision of the p⁺ impurity region 70 means the equivalent insertion of a diode 110 between the drain of the JFET 102 and the voltage source 150L, so that the charging current is supplied to the bootstrap capacity element 200 through the diode 110 and the JFET 102. In short the charging current supplied from the voltage source 150L goes through the p⁺ impurity region 70 which is an anode region of the diode 110, the n⁻ semiconductor layer 3 in the slit region 105, and the n⁻ semiconductor layer 3 in the high-potential island region 101 in order, to be supplied to the bootstrap capacity element 200.

In such ways, in the semiconductor device of the seventh preferred embodiment where the charging current is supplied to the bootstrap capacity element 200 through the diode formed of the p⁺ impurity region 70 and the n⁻ semiconductor layer 3 in contact thereto, the leakage of the accumulated electric charge in the bootstrap capacity element 200 can be reduced even when the potential $V_b$ becomes higher than the potential $V_L$ after the charging has completed.

Moreover, in the semiconductor device of the seventh preferred embodiment where the n⁺ buried impurity region 71 having a higher impurity concentration than the n⁻ semiconductor layer 3 is provided, the leakage of the charging current caused by a parasitic bipolar transistor formed in the semiconductor device can be reduced. This is explained below in detail.

Figure 30:
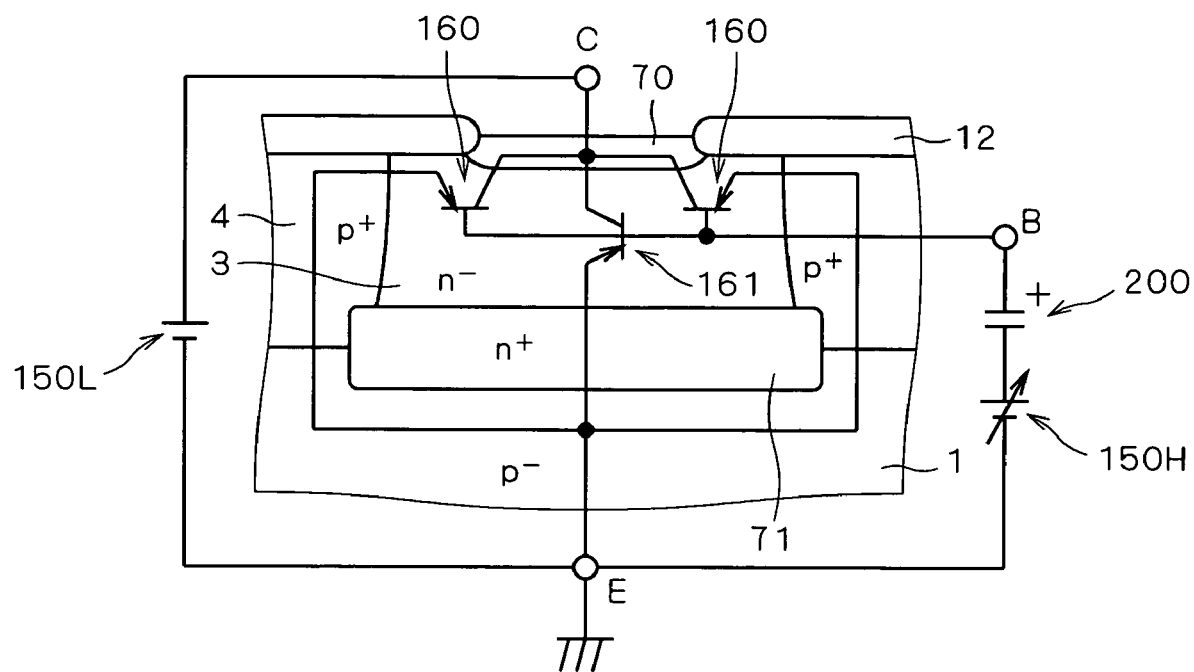
FIG. 30 shows a parasitic bipolar transistor.

FIG. 30 shows the parasitic bipolar transistor formed in the semiconductor device of the seventh preferred embodiment, which is a cross-sectional view taken along the line L-L indicated by the arrows in FIG. 25. For simplicity's sake, the electrode 16 and the insulating films 8 and 18 are not shown in FIG. 30.

As shown in FIG. 30, the p⁺ impurity region 4, the n⁻ semiconductor layer 3 and the p⁺ impurity region 70 form pnp parasitic bipolar transistors 160. Meanwhile, the p⁻ semiconductor substrate 1, the n⁻ semiconductor layer 3, the n⁺ buried impurity region 71 and the p⁺ impurity region 70 form a pnp parasitic bipolar transistor 161. The transistors 160 and 161 are connected in parallel.

In the semiconductor device of the seventh preferred embodiment where the above pnp parasitic bipolar transistors 160 and 161 are formed, when the transistors 160 and 161 operate in charging the bootstrap capacity element 200, part of the charging current supplied from the voltage source 150L becomes collector currents of the transistors and leaks toward the p⁻ semiconductor substrate 1 that is set at a ground potential. Therefore, the current amplification factors $h_{FE}$ of the transistors 160 and 161 need to be reduced in order to suppress the leakage of the charging current.

In the seventh preferred embodiment where the n⁺ buried impurity region 71 is provided at the interface between the n⁻ semiconductor layer 3 and the p⁻ semiconductor substrate 1 in the low-potential island region 104 below the p⁺ impurity region 70, the impurity concentration of a base region of the pnp parasitic bipolar transistor 161 increases higher than when the region 71 is not provided. This reduces the current amplification factor $h_{FE}$ of the transistor 161, thereby suppressing the leakage of the charging current.

On the other hand, the current amplification factor $h_{FE}$ of the pnp parasitic bipolar transistors 160 can be reduced by widening a distance L between the p⁺ impurity region 4 and the p⁺ impurity region 70, as shown in FIG. 28.

In the seventh preferred embodiment, the provision of the n⁺ buried impurity region 71 inhibits the spread of a depletion layer in the n⁻ semiconductor layer 3 in the low-potential island region 104. However, the n⁻ semiconductor layers 3 in the low-potential island region 104 and the high-potential island region 101 are connected not directly but through the n⁻ semiconductor layer 3 in the slit region 105. This n⁻ semiconductor layer 3 in the slit region 105 is easy to be depleted because the width W thereof is set to be narrower than the width HW of the n⁻ semiconductor layer 3 in the high-potential island region 101. Accordingly, the logic circuit 103 can be reliably surrounded by the depletion layer due to the RESURF effect, thereby reducing a breakdown voltage reduction caused by the provision of the n⁺ buried impurity region 7.

Eighth Preferred Embodiment

Figure 31:
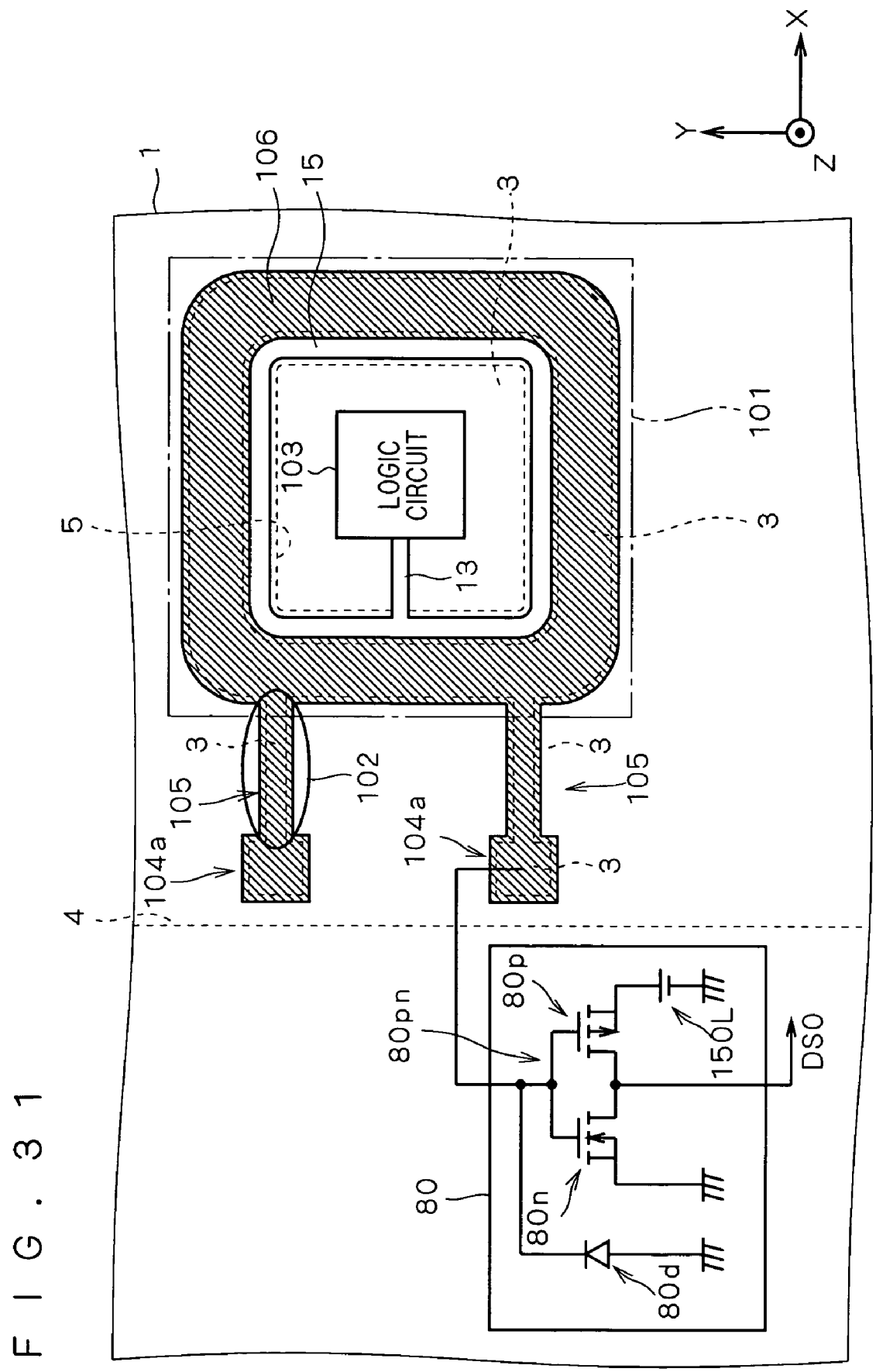
FIG. 31 is a plan view of a semiconductor device structure according to an eighth preferred embodiment of this invention.

FIG. 31 is a schematic plan view of a semiconductor device structure according to an eighth preferred embodiment of this invention. The semiconductor device of the eighth preferred embodiment is a modification of that of the aforementioned fourth preferred embodiment which basically includes only two pairs each of which consists of the slit region 105 and the divided region 104a, and a detection circuit 80 instead of the switch circuits SW that is electrically connected to the n⁻ semiconductor layer 3 in the divided region 104a of one pair.

As shown in FIG. 31, in the eighth preferred embodiment, two slit regions 105 and two divided regions 104a are provided, and the n⁻ semiconductor layers 3 in the divided regions 104a and the n⁻ semiconductor layers 3 in the slit regions 105 are connected one-on-one. The n⁺ impurity region 6 and the electrode 16 are independently provided for each of the divided regions 104a.

In the eighth preferred embodiment, the output potential $V_L$ at the voltage source 150L is applied to the n⁻ semiconductor layer 3 in one of the two divided regions 104a through the electrode 16 and the n⁺ impurity region 6, while the detection circuit 80 is electrically connected to the n⁻ semiconductor layer 3 in the other divided region 104a. The one and the other divided regions 104a are hereinafter referred to as "divided region 104aa" and "divided region 104ab", respectively. Further, one of the slit regions 105 paired with the divided region 104aa is referred to as a "slit region 105aa" and the other slit region 105 paired with the divided region 104ab as a "slit region 105ab".

The detection circuit 80 detects a potential V0 at the n⁻ semiconductor layer 3 in the divided region 104ab, and is provided in the aforementioned low breakdown voltage circuit. The detection circuit 80 includes an enhancement type p-channel MOSFET 80p, an enhancement type n-channel MOSFET 80n and a protective diode 80d, and is applied with the potential $V_L$ for its positive power supply potential.

The p-channel MOSFET 80p and the n-channel MOSFET 80n form a CMOS inverter 80pn, and the potential $V_L$ and a ground potential are respectively applied to the sources of the p-channel MOSFET 80p and the n-channel MOSFET 80n. The gates of the p-channel MOSFET 80p and the n-channel MOSFET 80n are electrically connected to the n⁻ semiconductor layer 3 in the divided region 104ab and further to the cathode of the protective diode 80d. A ground potential is applied to the anode of the protective diode 80d. The detection circuit 80 outputs the output potential at the CMOS inverter 80pn, i.e. the potential at the drains of the p-channel MOSFET 80p and the n-channel MOSFET 80n connected to each other, as a detection signal DS0.

The detection circuit 80 having the above structure outputs the detection signal DS0 of a high level when the potential V0 at the n⁻ semiconductor layer 3 in the divided region 104ab is less than a threshold potential $V_{th0}$ at the CMOS inverter 80pn, and outputs the detection signal DS0 of a low level when the potential V0 exceeds the threshold potential $V_{th0}$.

In the eighth preferred embodiment, the potential at the n⁻ semiconductor layer 3 in the high-potential island region 101, i.e. the potential $V_b$ can be indirectly detected by detecting the potential V0 with the detection circuit 80. This is explained below in detail.

Figure 32A:
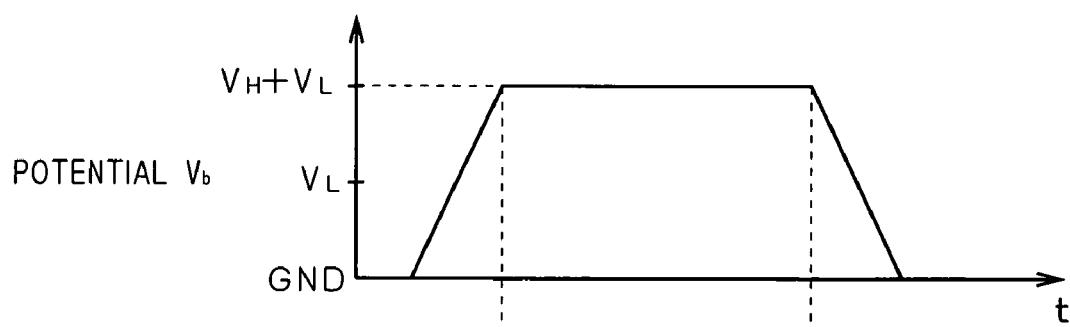
FIGS. 32A to 32C show potential waveforms of a potential $V_b$, a potential V0 and a detection signal DS0, respectively.
Figure 32B:
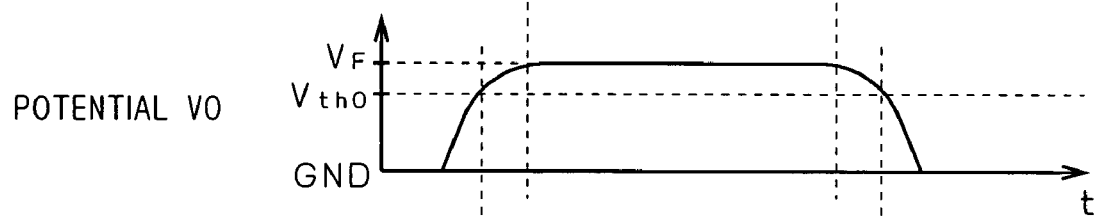
Figure 32C:
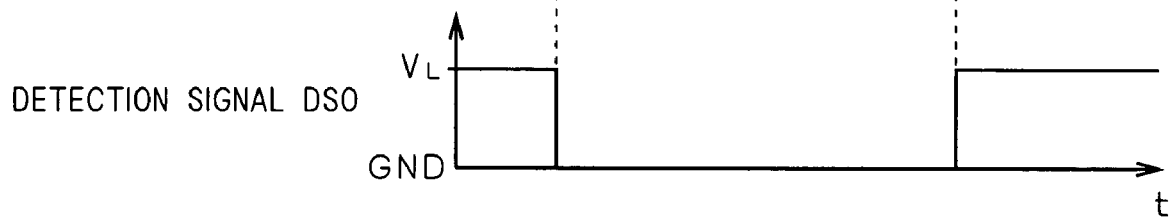

FIGS. 32A to 32C show potential waveforms of the potential $V_b$, the potential V0 and the detection signal DS0, respectively, FIG. 32A indicating the potential $V_b$, FIG. 32B indicating the potential V0, and FIG. 32C indicating the detection signal DS0. As shown in FIG. 32A, when the potential $V_L$ is applied to the n⁻ semiconductor layer 3 in the divided region 104aa to start charging the bootstrap capacity element 200, the potential $V_b$ increases. With the increase in the potential $V_b$, the potential V0 that can be regarded as being in a floating state is induced by the potential $V_b$ and increases, as shown in FIG. 32B. Then, with the increase in the potentials $V_b$ and V0, the proportion of a depletion layer in the n⁻ semiconductor layer 3 in the divided region 104ab increases.

When the charging to the bootstrap capacity element 200 has completed and $V_b$ increases to $V_L$, the output potential $V_S$ at the virtual voltage source 150H is set at the potential $V_H$, whereby the potential $V_b$ increases to $(V_L+V_H)$. At this time, the potential V0 only increases to a potential $V_F$ where the n⁻ semiconductor layer 3 in the divided region 104ab is completely covered with the depletion layer, which is set at several tens of volts. Thus the potential V0 does not increase higher than several tens of volts. The value of the potential $V_F$ can be adjusted by varying the width W of the n⁻ semiconductor layer 3 in the slit region 105ab. For instance, the potential $V_F$ is set at several tens of volts by setting the width W to satisfy the aforementioned expression (1).

In such ways, in the eighth preferred embodiment, the potential V0 increases as the potential $V_b$ increases, and does not increase higher than several tens of volts even when the potential $V_b$ becomes several hundred volts. Therefore, the potential V0 can be detected by a circuit like the detection circuit 80 that operates with a power supply of several tens of volts.

In the detection circuit 80, the threshold potential $V_{th0}$ at the CMOS inverter 80pn is set to be lower than the potential $V_F$. Accordingly, as shown in FIG. 32C, the detection circuit 80 outputs the detection signal DS0 of a low level at the start of charging to the bootstrap capacity element 200, and outputs the detection signal DS0 of a low level when the charging has completed and the potential $V_b$ becomes a high potential.

In such ways, in the semiconductor device of the eighth preferred embodiment where the potential V0 at the n⁻ semiconductor layer 3 in the divided region 104ab increases with an increase in the potential $V_b$, observations of potential variations in the n⁻ semiconductor layer 3 in the high-potential island region 101 can be made by detecting the potential V0.

Further, because the potential V0 stops increasing after the potentials $V_b$ and V0 increase to completely deplete the n⁻ semiconductor layer 3 in the slit region 105ab, even when a high potential is applied to the n⁻ semiconductor layer 3 in the high-potential island region 101, the detection circuit 80 can operate with a relatively low potential power supply as in the eighth preferred embodiment by properly adjusting the width W of the n⁻ semiconductor layer 3 in the slit region 105ab. This reduces the circuit scale of the whole semiconductor device.

Still further, because the width W of the n⁻ semiconductor layer 3 in the slit region 105ab is set to be narrower than the width HW of the n⁻ semiconductor layer 3 in the high-potential island region 101, the width W can be adjusted while maintaining the width HW. Therefore, the potential V0 where the whole n⁻ semiconductor layer 3 in the slit region 105ab is depleted can be lowered while keeping a region where the logic circuit 103 is be formed.

Moreover, thanks to the detection circuit 80 that outputs the detection signal DS0 of a low level when the potential V0 exceeds the positive threshold potential $V_{th0}$, a rough judgment can be made whether the bootstrap capacity element 200 is being charged or not.

Ninth Preferred Embodiment

Figure 33:
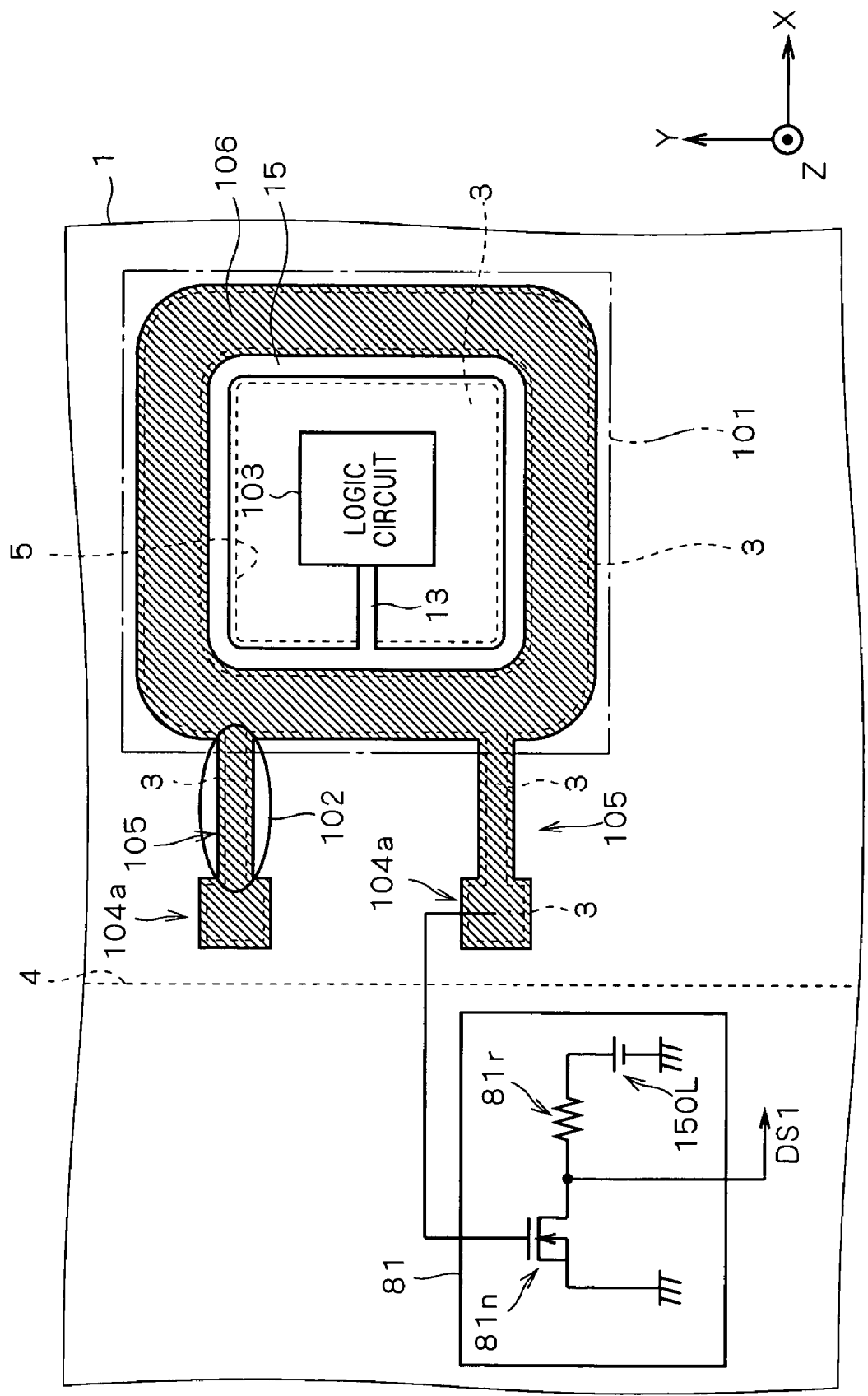
FIG. 33 is a plan view of a semiconductor device structure according to a ninth preferred embodiment of this invention.

FIG. 33 is a schematic plan view of a semiconductor device structure according to a ninth preferred embodiment of this invention. The semiconductor device of the ninth preferred embodiment is a modification of that of the aforementioned eighth preferred embodiment which includes a detection circuit 81 instead of the detection circuit 80.

As shown in FIG. 33, the detection circuit 81 includes a depression type n-channel MOSFET 81n and a resistor 81r, and is applied with the potential $V_L$ for its positive power supply potential. The n-channel MOSFET 81n has a drain connected to one end of the resistor 81r and a source applied with a ground potential. The potential $V_L$ is applied to the other end of the resistor 81r. The detection circuit 81 outputs the drain potential of the n-channel MOSFET 81n as a detection signal DS1. The detection circuit 81 is also provided in the aforementioned low breakdown voltage circuit.

The detection circuit 81 having the above structure outputs the detection signal DS1 of a low level when the potential V0 at the n⁻ semiconductor layer 3 in the divided region 104ab is higher than its negative threshold potential $V_{th1}$, and outputs the detection signal DS1 of a high level when the potential V0 is lower than the threshold potential $V_{th1}$.

As discussed above, the other end 200b of the bootstrap capacity element 200 is connected, for example, to the node between two IGBTs that are totem-pole-connected between the potential $V_H$ and a ground potential. When a load of an inductor component is connected to the node, a transition of the high-potential side IGBT from the ON state to the OFF state together with a transition of the low-potential side IGBT from the ON state to the OFF state produces spike noise of a negative potential at the node due to the inductor component. Resultant application of a high negative potential to the other end 200b renders the potential $V_b$ negative. Consequently, a forward voltage is applied to a pn junction formed of the p⁻ semiconductor substrate 1 and the n⁻ semiconductor layer 3 and a high current passes through the p⁻ semiconductor substrate 1, possibly causing the low breakdown voltage circuit to malfunction.

Accordingly, the application of a negative potential to the n⁻ semiconductor layer 3 in the high-potential island region 101 needs to be detected in order to perform a protective operation on the low breakdown voltage circuit. In the semiconductor device of the ninth preferred embodiment, the application of a negative potential to the n⁻ semiconductor layer 3 in the high-potential island region 101 can be indirectly detected by detecting the potential V0 at the n⁻ semiconductor layer 3 in the divided region 104ab with the detection circuit 81. This is explained below in detail.

Figure 34A:
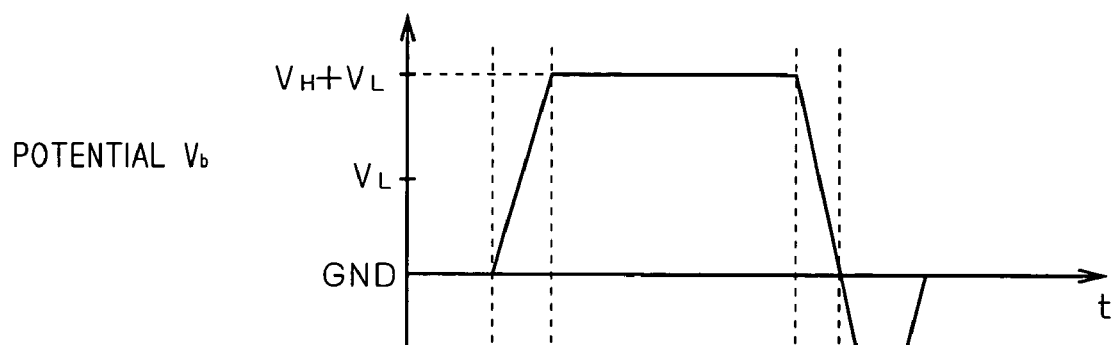
FIGS. 34A to 34C show potential waveforms of the potential $V_b$, the potential V0 and a detection signal DS1, respectively.
Figure 34B:
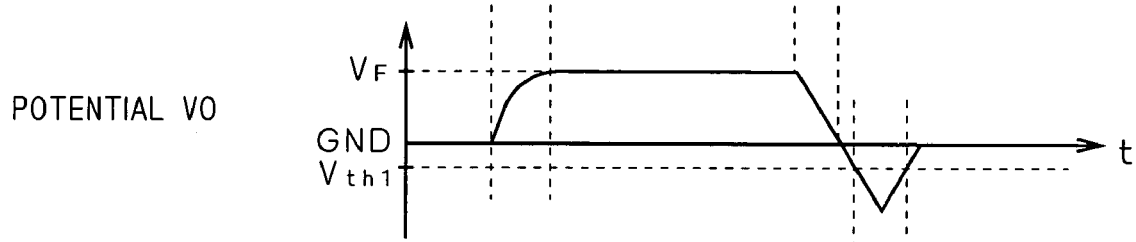
Figure 34C:
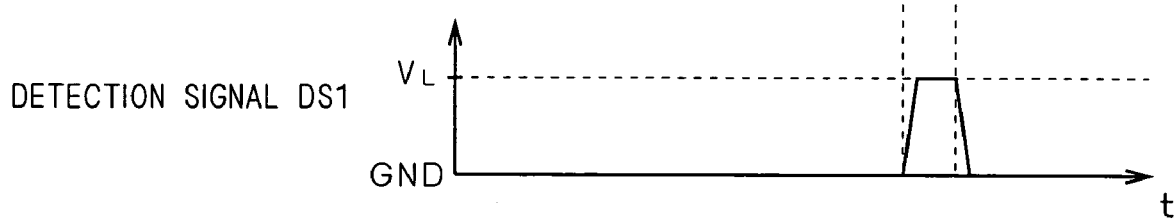

FIGS. 34A to 34C show potential waveforms of the potential $V_b$, the potential V0 and the detection signal DS1, respectively, FIG. 34A indicating the potential $V_b$, FIG. 34B indicating the potential V0, and FIG. 34C indicating the detection signal DS1. As shown in FIGS. 34A and 34B, the charging to the bootstrap capacity element 200 starts and the potential $V_b$ increases, whereby the potential V0 increases. Then, the charging completes and the potential $V_S$ is set at the potential $V_H$, whereby the potential $V_b$ becomes $(V_L+V_H)$. At this time, the potential V0 only increases to the potential $V_F$ where the n⁻ semiconductor layer 3 in the slit region 105ab is completely covered with a depletion layer, as discussed above.

Between the two IGBTs connected to the other end 200b of the bootstrap capacity element 200, a transition of the high-potential side IGBT from the ON state to the OFF state together with a transition of the low-potential side IGBT from the OFF state to the ON state reduces the potential $V_H$, thereby reducing the potential $V_b$. Then, the potential $V_H$ becomes negative due to the load of the inductor component connected to the IGBTs, whereby the potential $V_b$ also becomes negative. At this time, as shown in FIG. 34B, the potential V0 is induced by the potential $V_b$ and also becomes negative.

When the potential V0 bears negative and lower than the negative threshold potential $V_{th1}$ at the n-channel MOSFET 81n in the detection circuit 81, the n-channel MOSFET 81n enters the OFF state and as shown in FIG. 34C, the detection circuit 81 outputs the detection signal DS1 of a high level. Subsequently, the potential $V_H$ becomes a ground potential to render the potential $V_b$ a ground potential as well, whereby the potential V0 also becomes a ground potential. When the potential V0 is a ground potential which is higher than the threshold potential $V_{th1}$ at the n-channel MOSFET 81n, the detection circuit 81 outputs the detection signal DS1 of a low level.

In such ways, in the semiconductor device of the ninth preferred embodiment where the potential V0 is induced by the potential at the n⁻ semiconductor layer 3 in the high-potential island region 101, the application of a negative potential to the n⁻ semiconductor layer 3 in the high-potential island region 101 can be detected by detecting whether the potential V0 is negative or not with the detection circuit 81. Therefore, the application of the forward voltage to the pn junction formed of the p⁻ semiconductor substrate 1 and the n⁻ semiconductor layer 3 can be prevented, thereby preventing a malfunction in the low breakdown voltage circuit.

Further, like the semiconductor device of the eighth preferred embodiment, because the potential V0 stops increasing after the potentials $V_b$ and V0 increase to completely deplete the n⁻ semiconductor layer 3 in the slit region105ab, even when a high potential is applied to the n⁻ semiconductor layer 3 in the high-potential island region 101, the detection circuit 81 can operate with a relatively low potential power supply as in the ninth preferred embodiment by properly adjusting the width W of the n⁻ semiconductor layer 3 in the slit region 105ab. This reduces the circuit scale of the whole semiconductor device.

Still further, because the width W of the n⁻ semiconductor layer 3 in the slit region 105ab is set to be narrower than the width HW of the n⁻ semiconductor layer 3 in the high-potential island region 101, the width W can be adjusted while maintaining the width HW. Therefore, the potential V0 where the whole n⁻ semiconductor layer 3 in the slit region 105ab is depleted can be lowered while keeping a region where the logic circuit 103 is be formed.

As is clear from the above discussion, the semiconductor devices of the eighth and ninth preferred embodiments have a structure where a pair consisting of the low-potential island region 104 and the slit region 105 and a detection circuit for detecting the potential V0 at the n⁻ semiconductor layer 3 in the additionally provided low-potential island region 104 is provided in the semiconductor device of the first preferred embodiment. Alternatively, the semiconductor devices of the second to seventh preferred embodiments produce similar effects to those of the semiconductor devices of the eighth and ninth preferred embodiments by providing the similar structures therein.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
a semiconductor substrate of p-type;
a semiconductor layer of n-type formed on said semiconductor substrate; and
a first impurity region of said p-type formed in said semiconductor layer, extending from an upper surface of said semiconductor layer to an interface between said semiconductor layer and said semiconductor substrate to surround a part of said semiconductor layer, said first impurity region having a higher impurity concentration than said semiconductor layer,
said part of said semiconductor layer including:
a first region sandwiched by said first impurity region so that said first impurity region contacts said first region from both sides of said first region in a first direction parallel to said upper surface of said semiconductor layer,
a second region located apart from said first region and electrically connected to an electrode located directly above said second region, and
a third region located between said first region and said second region to come in contact with said first region and said second region, said third region being sandwiched by said first impurity region so that said first impurity region contacts said third region from both sides of said third region in a second direction parallel to said upper surface of said semiconductor layer and said first direction,
in plan view, said first region, said third region and said second region being arranged along a direction parallel to said upper surface of said semiconductor layer and perpendicular to said first direction and said second direction in this order,
said semiconductor device further comprising:
a first buried impurity region of said n-type formed at an interface between said first region and said semiconductor substrate, said first buried impurity region having a higher impurity concentration than said semiconductor layer; and
a semiconductor element formed in said semiconductor layer above said first buried impurity region, wherein
a capacity element is electrically connected to said first region, and
in plan view, a width of said third region in said second direction is narrower than a width of said first region in said first direction.

2. The semiconductor device according to claim 1, wherein said width of said third region satisfies the following expression:

$$w = 2\sqrt{2 \cdot \epsilon_s \cdot V_L/(q \cdot N_d)}$$

where $N_a \gg N_d$,
$\epsilon_s$ denotes a dielectric constant (F/cm) of a semiconductor,
$V_L$ denotes a potential (V) at said semiconductor layer in said second region with respect to said first impurity region,
q denotes a unit charge quantity (C),
$N_d$ denotes an impurity concentration ($cm^{-3}$) of said semiconductor layer, and $N_a$ denotes an impurity concentration ($cm^{-3}$) of said first impurity region.

3. The semiconductor device according to claim 1, further comprising a second buried impurity region of said p-type provided at an interface between said third region and said semiconductor substrate as connected to said first impurity region, said second buried impurity region having a higher impurity concentration than said semiconductor layer.

4. The semiconductor device according to claim 1, wherein said part of said semiconductor layer includes a plurality of regions, each of said plurality of regions being said third regions.

5. The semiconductor device according to claim 4, wherein said second region includes a plurality of divided regions, and
said plurality of divided regions are connected to said plurality of regions one-on-one.

6. The semiconductor device according to claim 4, further comprising:
an insulating film provided on said plurality of regions; and
a plurality of conductive films provided on said insulating film correspondingly to said plurality of regions one-on-one.

7. The semiconductor device according to claim 1, further comprising:
an insulating film provided on said third region; and
a conductive film provided on said insulating film.

8. The semiconductor device according to claim 1, wherein said part of said semiconductor layer further includes:
a fourth region located apart from said first region; and
a fifth region located between said first region and said fourth region to come in contact with said first region and said fourth region, said fifth region being sandwiched by said first impurity region so that said first impurity region contacts said fifth region from both sides of said fifth region in a third direction parallel to said upper surface of said semiconductor layer and said first direction,
in plan view, said first region, said fifth region and said fourth region being arranged along a direction parallel to said upper surface of said semiconductor layer and perpendicular to said first direction and said third direction in this order, and
in plan view, a width of said fifth region in said third direction is narrower than a width of said first region in said first direction,
said semiconductor device further comprising a detection circuit for detecting a potential at said fourth region.

9. The semiconductor device according to claim 8, wherein said detection circuit outputs a detection signal when said potential at said fourth region becomes higher than its positive threshold potential.

10. The semiconductor device according to claim 8, wherein
said detection circuit outputs a detection signal when said potential at said fourth region becomes lower than its negative threshold potential.

11. A semiconductor device comprising:
a semiconductor substrate of p-type;
a semiconductor layer of n-type formed on said semiconductor substrate;
a first impurity region of said p-type formed in said semiconductor layer, extending from an upper surface of said semiconductor layer to an interface between said semiconductor layer and said semiconductor substrate, to surround a part of said semiconductor layer, said first impurity region having a higher impurity concentration than said semiconductor layer, said part of said semiconductor layer including:
a first region sandwiched by said first impurity region so that said first impurity region contacts said first region from both sides of said first region in a first direction parallel to said upper surface of said semiconductor layer,
a second region located apart from said first region, and
a third region located between said first region and said second region to come in contact with said first region and said second region, said third region being sandwiched by said first impurity region so that said first impurity region contacts said third region from both sides of said third region in a second direction parallel to said upper surface of said semiconductor layer and said first direction,
in plan view, said first region, said third region and said second region being arranged along a direction parallel to said upper surface of said semiconductor layer and perpendicular to said first direction and said second direction in this order,
said semiconductor device further comprising:
a first buried impurity region of said n-type formed at an interface between said first region and said semiconductor substrate, said first buried impurity region having a higher impurity concentration than said semiconductor layer;
a semiconductor element formed in said semiconductor layer above said first buried impurity region;
a second impurity region of said p-type provided apart from said first impurity region in an upper surface of said second region; and
a second buried impurity region of said n-type provided at an interface between said second region and said semiconductor substrate directly below said second impurity region, said second buried impurity region having a higher impurity concentration than said semiconductor layer, wherein a capacity element is electrically connected to said first region; and
in plan view, a width of said third region in said second direction is narrower than a width of said first region in said first direction.

12. The semiconductor device according to claim 11, wherein
said part of said semiconductor layer further includes:
a fourth region located apart from said first region; and
a fifth region located between said first region and said fourth region to come in contact with said first region and said fourth region said fifth region being sandwiched by said first impurity region so that said first impurity region contacts said fifth region from both sides of said fifth region in a third direction parallel to said upper surface of said semiconductor layer and said first direction,
in plan view, said first region, said fifth region and said fourth region being arranged along a direction parallel to said upper surface of said semiconductor layer and perpendicular to said first direction and said third direction in this order, and
in plan view, a width of said fifth region in said third direction is narrower than a width of said first region in said first direction,
said semiconductor device further comprising a detection circuit for detecting a potential at said fourth region.

13. The semiconductor device according to claim 12, wherein
said detection circuit outputs a detection signal when said potential at said fourth region becomes higher than its positive threshold potential.

14. The semiconductor device according to claim 12, wherein
said detection circuit outputs a detection signal when said potential at said fourth region becomes lower than its negative threshold potential.

* * * * *